(12) United States Patent
Sawa et al.

(10) Patent No.: US 9,578,413 B2
(45) Date of Patent: Feb. 21, 2017

(54) AUDIO PROCESSING SYSTEM AND AUDIO PROCESSING METHOD

(71) Applicant: PANASONIC INTELLECTUAL PROPERTY MANAGEMENT CO., LTD., Osaka (JP)

(72) Inventors: Hirotaka Sawa, Fukuoka (JP); Toshimichi Tokuda, Fukuoka (JP); Shuichi Watanabe, Fukuoka (JP); Hiroyuki Matsumoto, Fukuoka (JP); Hisashi Tsuji, Fukuoka (JP); Shintaro Yoshikuni, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 2 days.

(21) Appl. No.: 14/809,618

(22) Filed: Jul. 27, 2015

(65) Prior Publication Data
US 2016/0043699 A1 Feb. 11, 2016

(30) Foreign Application Priority Data
Aug. 5, 2014 (JP) .................................. 2014-159736

(51) Int. Cl.
*H03G 3/24* (2006.01)
*H04R 1/40* (2006.01)
(Continued)

(52) U.S. Cl.
CPC ................ *H04R 1/406* (2013.01); *H03G 3/32* (2013.01); *H04R 3/005* (2013.01); *H04R 2430/01* (2013.01); *H04R 2499/11* (2013.01)

(58) Field of Classification Search
CPC ............ H03G 3/24; H03G 3/32; H04R 3/005; H04R 1/406; H04R 2499/11; H04R 2430/01
See application file for complete search history.

(56) References Cited

U.S. PATENT DOCUMENTS

2010/0106272 A1* 4/2010 Sato ................. G11B 20/10527
700/94
2012/0063613 A1* 3/2012 Sato ....................... H04R 3/005
381/92

(Continued)

FOREIGN PATENT DOCUMENTS

| JP | 2004-180197 | 6/2004 |
|---|---|---|
| JP | 2012-070070 | 4/2012 |
| WO | 2014/103331 | 7/2014 |

*Primary Examiner* — Brenda Bernardi
(74) *Attorney, Agent, or Firm* — Greenblum & Bernstein, P.L.C.

(57) ABSTRACT

An audio processing system, includes: an audio collector that collects audio in a non-directivity state using audio collection elements; an operator receives an input of one or more designation directions for audio emphasis for switching from the non-directivity state to a directivity state; an emphasis processor that generates audio data in the directivity state obtained by performing an emphasis process on the audio data in the designation direction from the audio collector using audio data collected by the audio collector according to the input of the designation direction; a volume adjustor that adjusts volume of the audio data in a directivity state; and an audio output that outputs the audio in a non-directivity state collected by the audio collector or the audio in a directivity state after the volume has been adjusted by the volume adjustor.

16 Claims, 39 Drawing Sheets

(51) Int. Cl.
*H04R 3/00* (2006.01)
*H03G 3/32* (2006.01)

(56) References Cited

U.S. PATENT DOCUMENTS

2012/0180093 A1    7/2012  Ishihara et al.
2015/0237455 A1*   8/2015  Mitra .................. H04S 7/30
                                                    381/92
2015/0350621 A1   12/2015  Sawa et al.

* cited by examiner

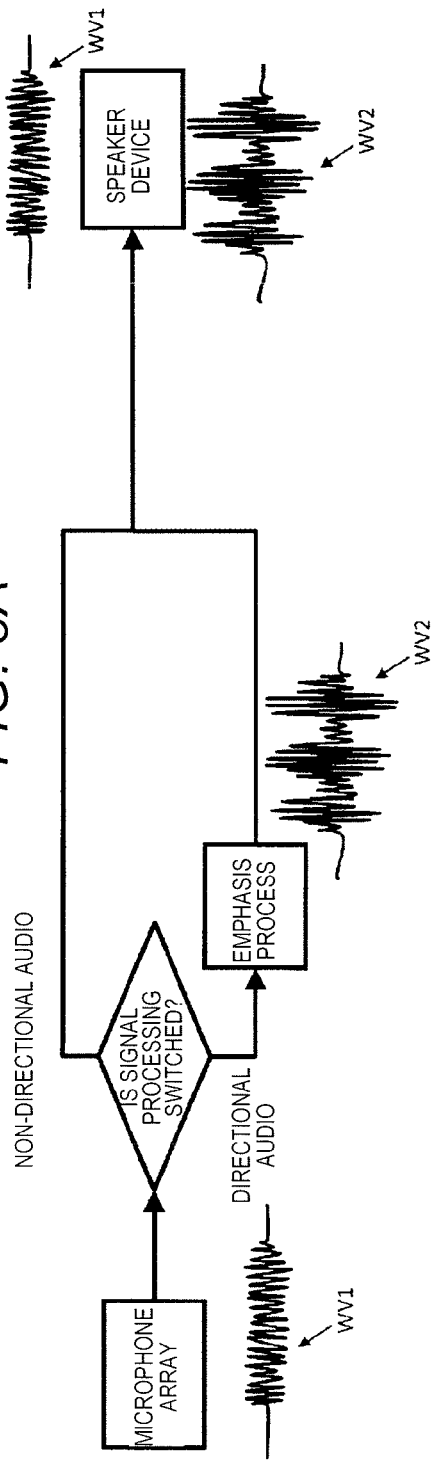
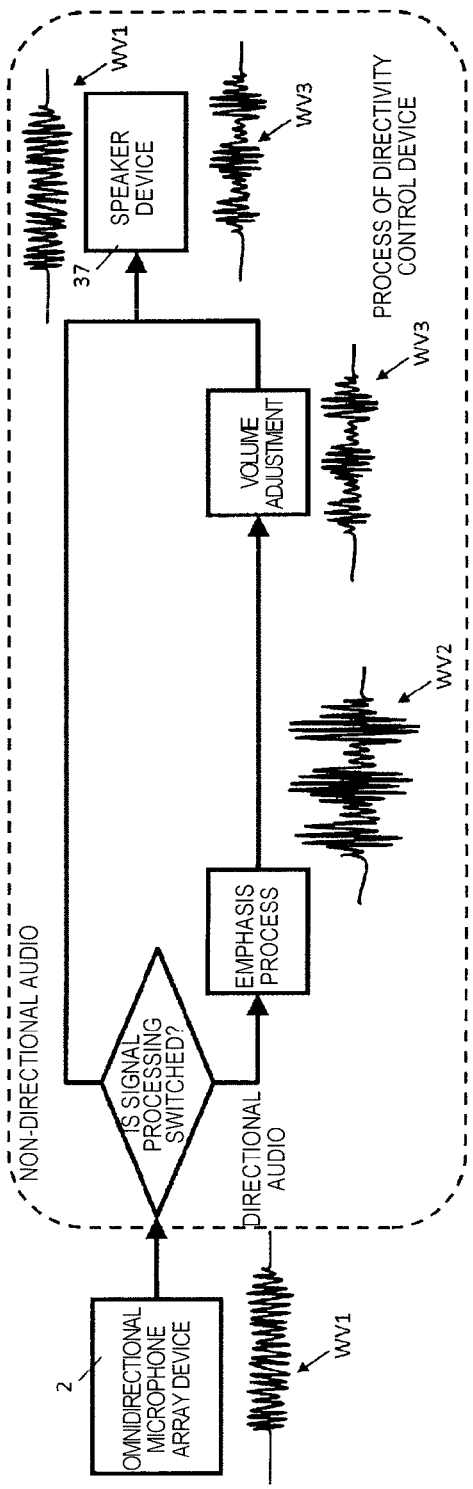

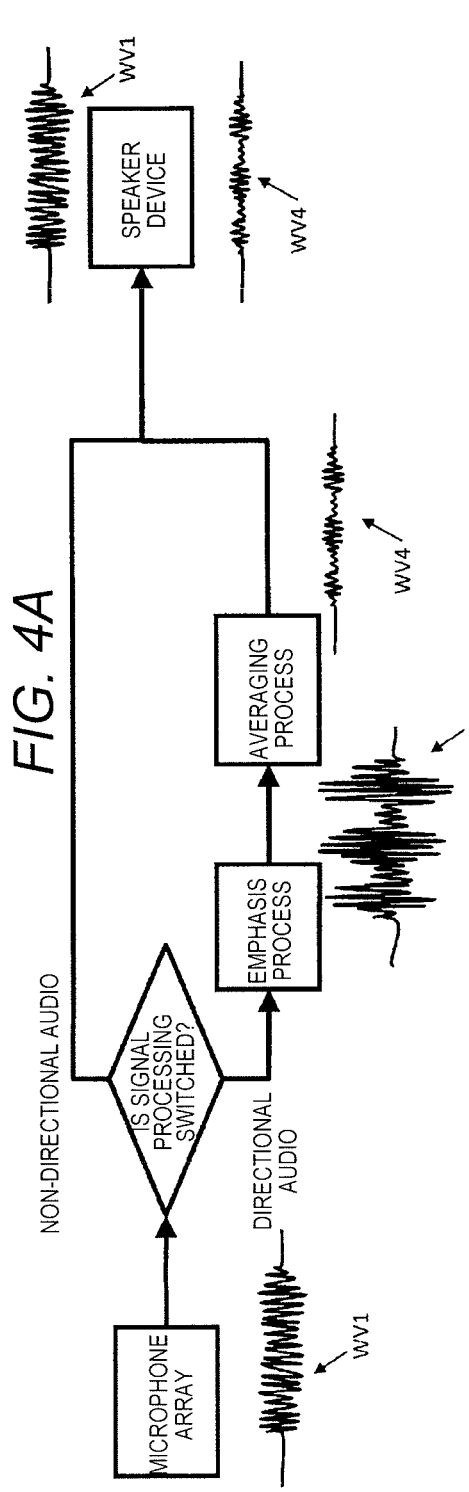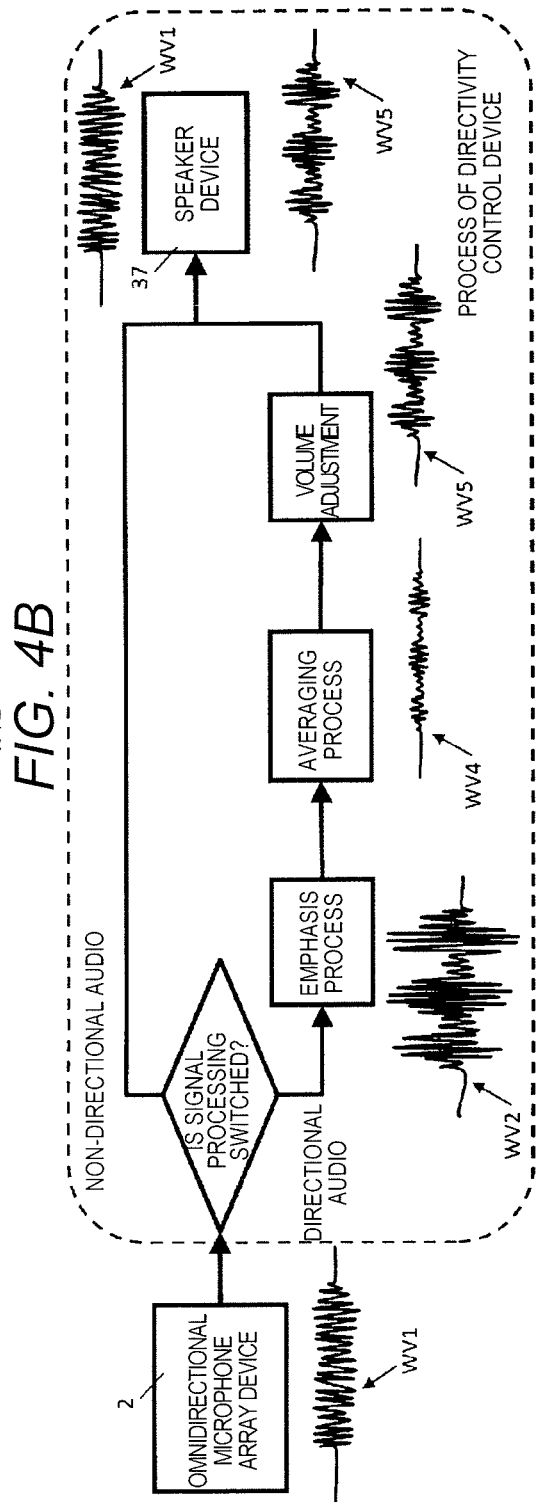

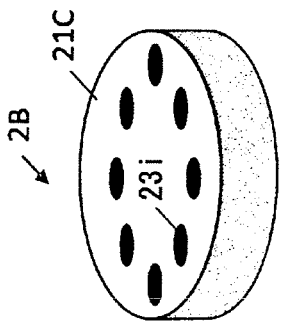
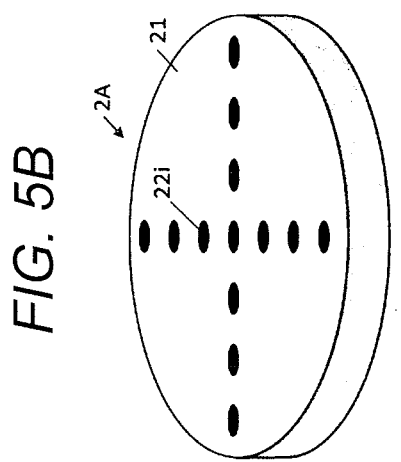
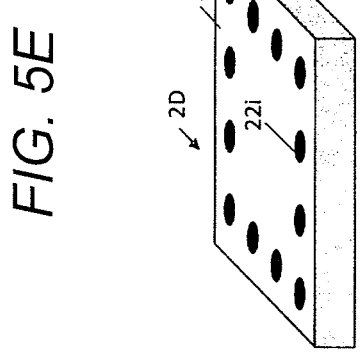
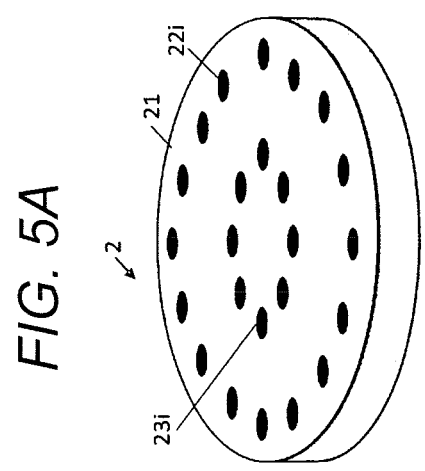
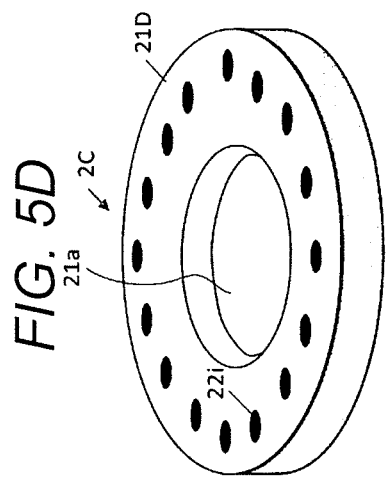

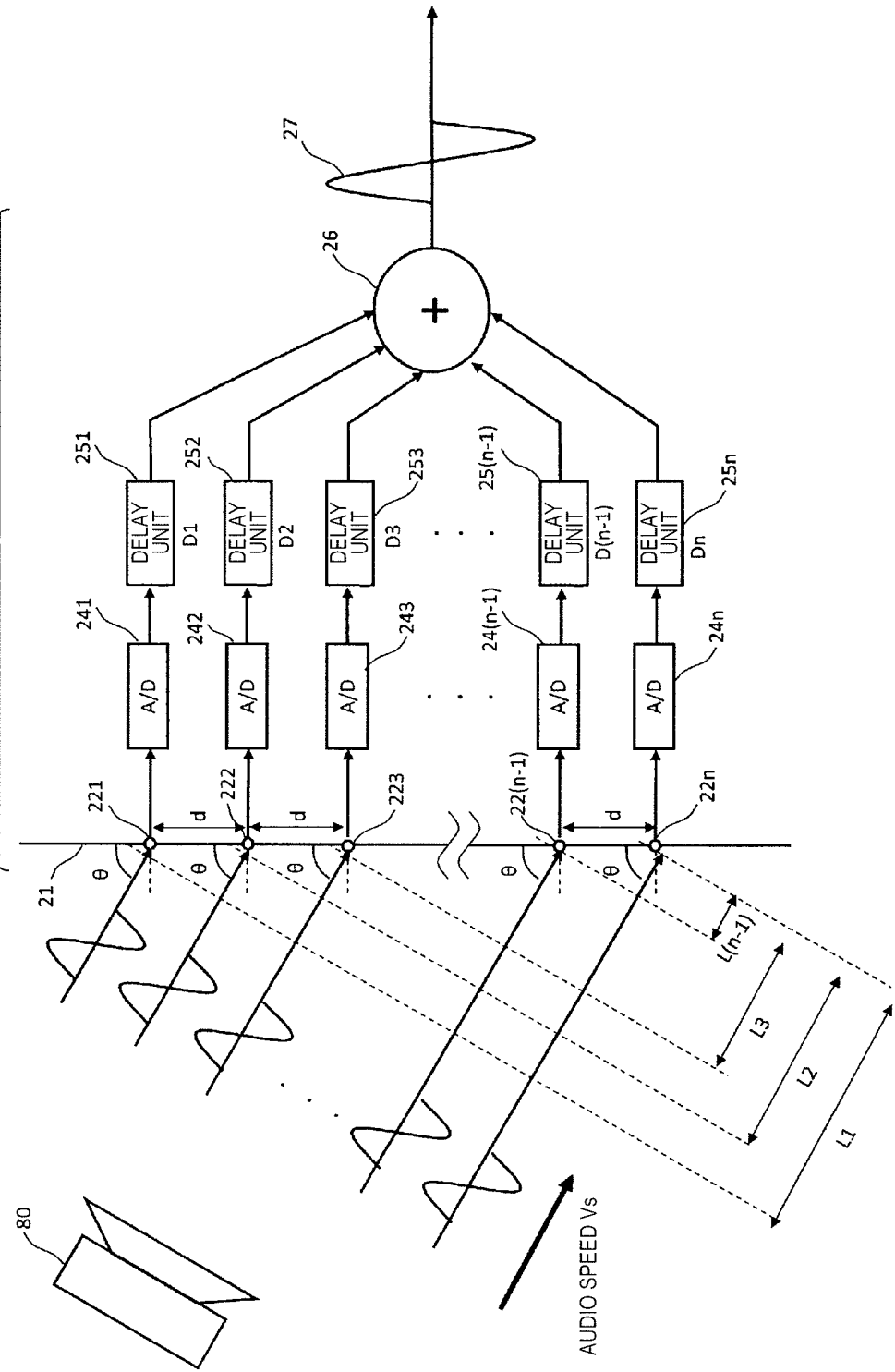

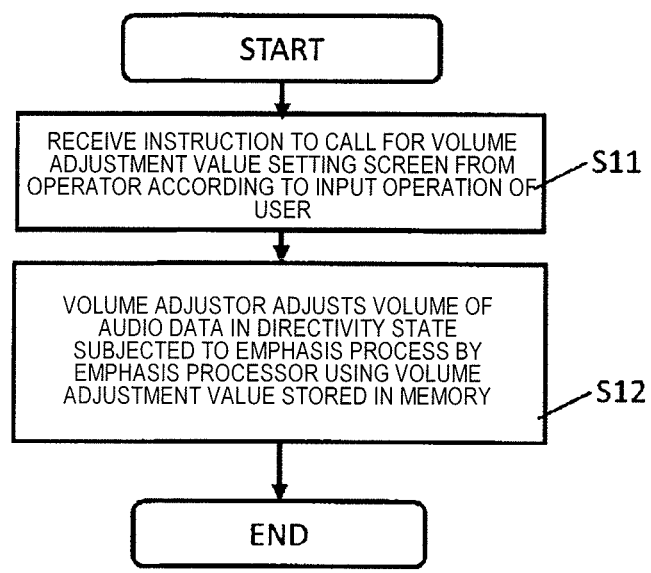

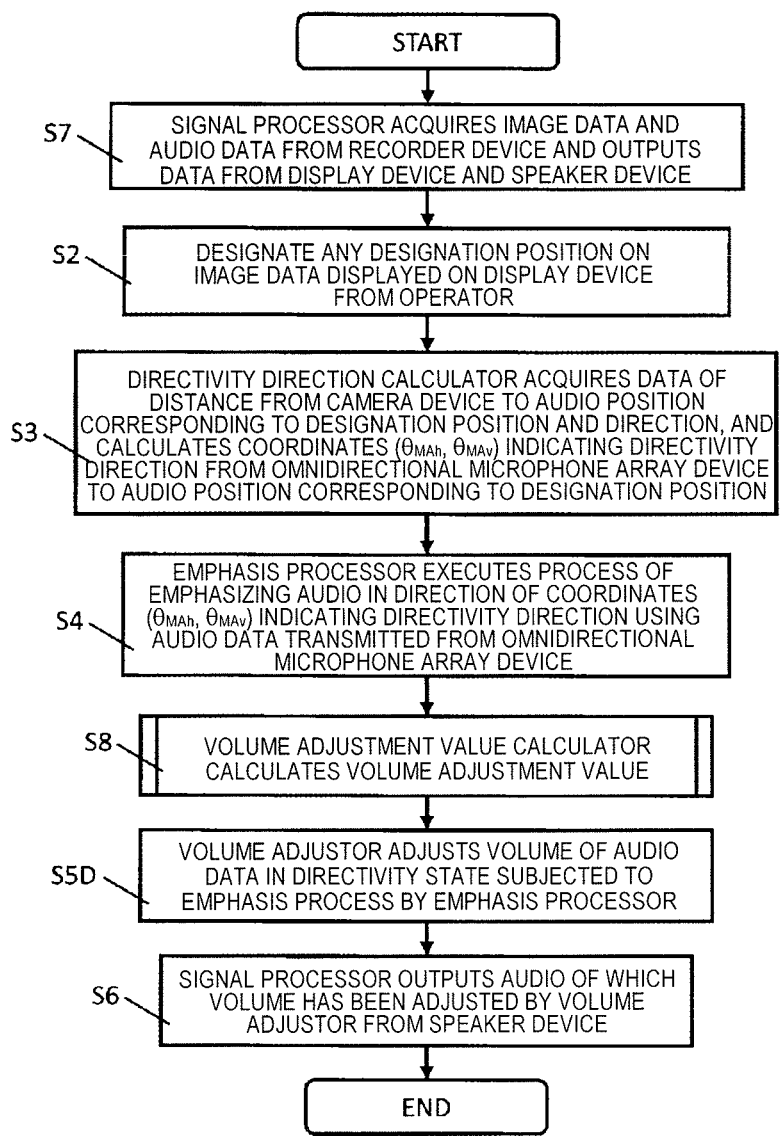

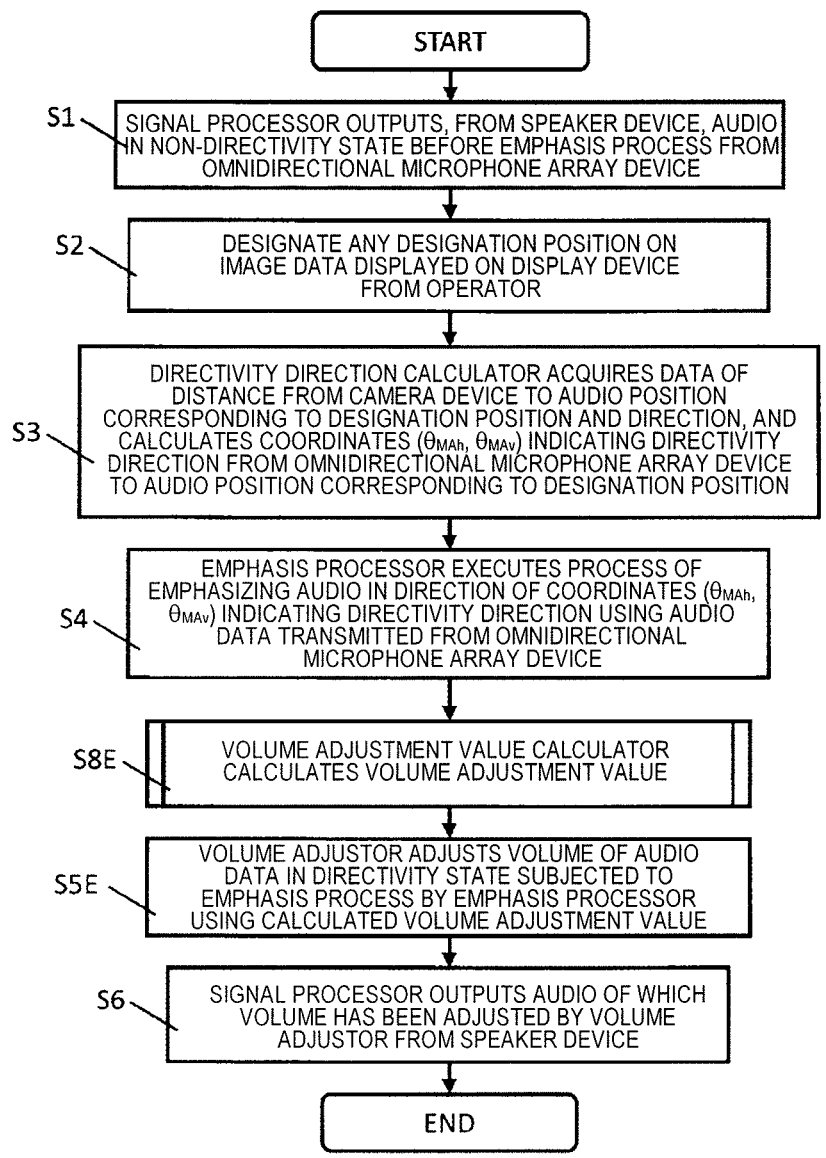

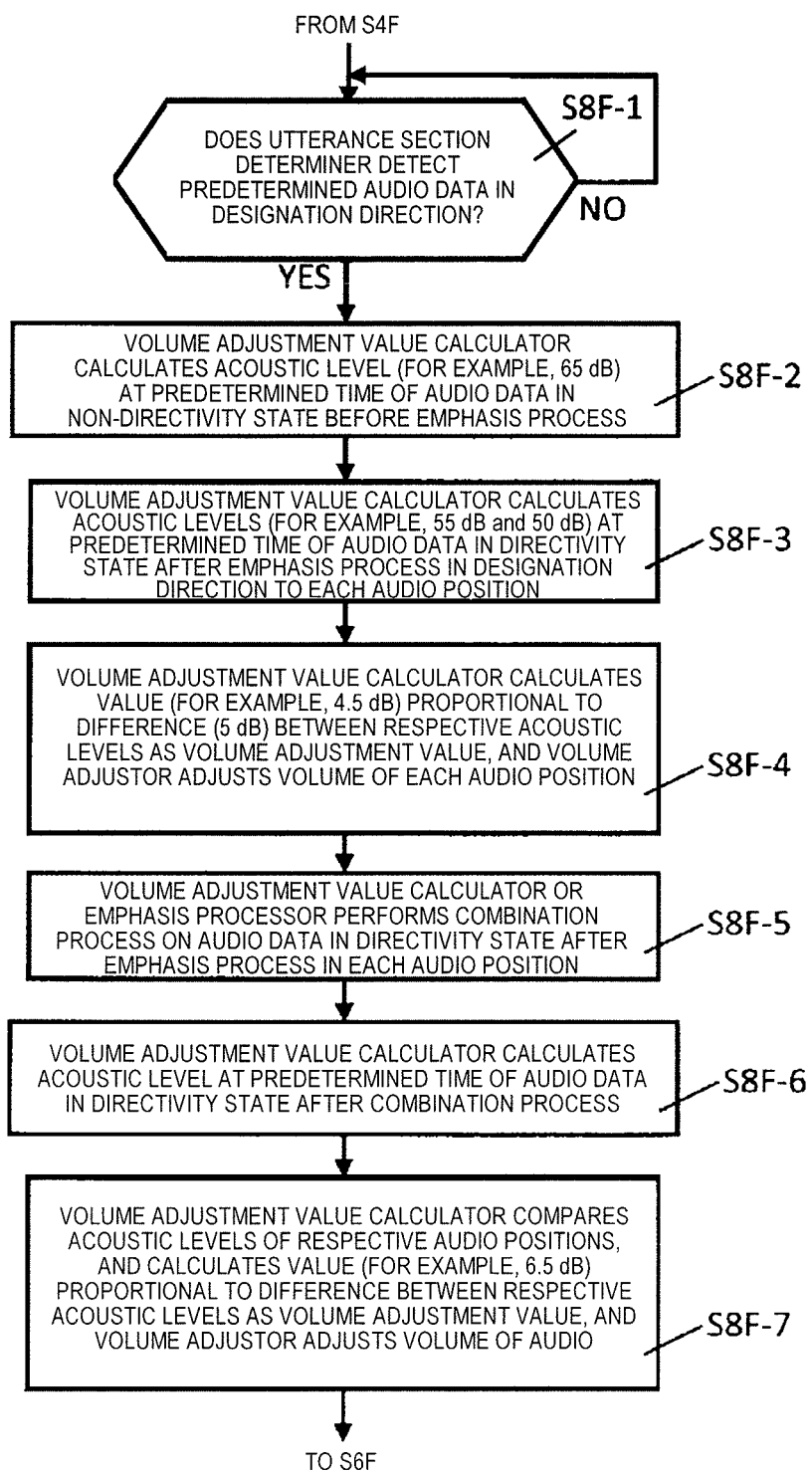

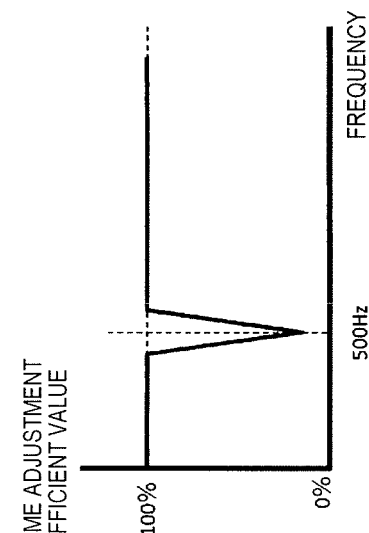
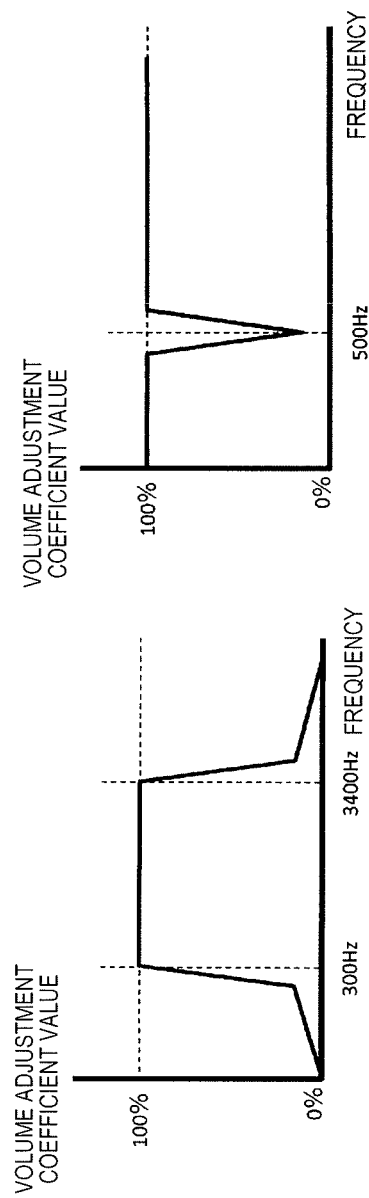

AUDIO PROCESSING SYSTEM AND AUDIO PROCESSING METHOD

BACKGROUND

1. Technical Field

The present disclosure relates to an audio processing system and an audio processing method for adjusting the volume of audio collected in a microphone array device.

2. Description of the Related Art

In a monitoring system installed in a predetermined position (for example, ceiling) of a factory, a store (for example, a retail store or a bank) or a public place (for example, a library), a plurality of camera devices (for example, pan-tilt camera device or omnidirectional camera device) are connected over a network to achieve a wide angle of view of image data (a still image and a moving image; the same applies hereinafter) in a predetermined range of a monitoring target.

An amount of information obtained by only monitoring an image is inevitably limited. Accordingly, there is a high demand for a monitoring system that obtains audio data in a direction in which a camera device images a specific subject by arranging a microphone array device as well as the camera device.

Here, for example, an information processing device shown in Japanese Patent Unexamined Publication No. 2004-180197 is known as related art for performing reproduction focused on audio in a direction of a point of interest of a reproduced image by indicating the point of interest of the reproduced image when data recorded by a plurality of microphones is reproduced.

The information processing device shown in Unexamined Japanese Patent Publication No. 2004-180197 includes a microphone array including a plurality of microphones, a plurality of holding means that hold, for each microphone, input acoustic signals from the individual microphones constituting the microphone array, input means that inputs position information, focusing means that performs acoustic focusing in an acquired positional direction using the held acoustic signals of a plurality of channels, and processing means that processes the acoustic signals in order to apply an acoustic effect to the acoustic signals after focusing. Examples of types of processing of the acoustic signals may include generally used acoustic processing, such as echoes, vibrato, or distortion.

In Unexamined Japanese Patent Application Publication No. 2004-180197, an output (volume) of the audio signal in a target direction is relatively greater than audio signals in directions other than the target direction since the output (volume) of the audio signal in the target direction is subjected to an emphasis process (for example, a directivity forming process; the same applies hereinafter). However, a difference between outputs (for example, volumes; the same applies hereinafter) before and after the emphasis process of the audio signal in the target direction is not considered.

In Unexamined Japanese Patent Publication No. 2004-180197, an emphasis process using a delay and sum scheme is used. When audio before the emphasis process (non-directional audio) and audio after the emphasis process (directional audio) are compared, noise included in the audio signal collected by each microphone has a low correlation for each microphone, and thus, the output of the directional audio is increased by an amount corresponding to an added audio signal for each microphone.

Further, in the emphasis process using a delay and sum scheme, the output of the audio signal after an addition process may be divided by the number of microphones and averaged to be the same as an output of one microphone. In this case, volume of an audio signal in a direction other than the target direction is suppressed through the emphasis process using a delay and sum scheme, and thus, the output of the directional audio is reduced when the output of the non-directional audio and the output of the directional audio are compared.

Therefore, in the emphasis process using a delay and sum scheme, the output of the non-directional audio and the output of the directional audio differ greatly due to the emphasis process regardless of whether the output of the audio signal after an addition process is divided by the number of microphones and averaged In particular, in the monitoring system described above, in a normal case (for example, when no event as a monitoring target occurs), a monitoring person (for example, a user of the monitoring system) listens to the sounds of an entire monitoring area in a non-directivity state before the emphasis process (that is, before directivity is formed). When abnormal sound is generated or when abnormal behavior on an image of the camera device is confirmed, a use situation in which the person listens to sound in a directivity state for directivity in a specific direction designated by the person (that is, after the directivity is formed) may be considered. When switching occurs between the non-directivity state and the directivity state, trouble occurs in a monitoring service of the monitoring person if there is a great difference in the output of the audio collected by the microphone array device.

SUMMARY

An object of the present disclosure is to provide an audio processing system and an audio processing method that suppress generation of a great difference in volume before and after an emphasis process and improve the convenience to a user by adjusting the volume of audio after performing an emphasis process on audio in a designation direction using audio collected by a microphone array device.

According to an aspect of the disclosure, there is provided an audio processing system, including: an audio collector that includes a plurality of audio collection elements, and collects audio in a non-directivity state using the audio collection elements; an operator that receives an input of one or more designation directions for audio emphasis for switching from the non-directivity state to a directivity state; an emphasis processor that generates audio data in the directivity state obtained by performing an emphasis process on the audio data in the designation direction from the audio collector using audio data collected by the audio collector according to the input of the designation direction; a volume adjustor that adjusts volume of the audio data in a directivity state generated by the emphasis processor; and an audio output that outputs the audio in the non-directivity state collected by the audio collector or the audio in the directivity state after the volume is adjusted by the volume adjustor.

According to another aspect of the disclosure, there is provided an audio processing method in an audio processing system including an audio collector that collects audio in a non-directivity state using a plurality of audio collection elements, the audio processing method including: receiving an input of one or more designation directions for audio emphasis for switching from the non-directivity state to a directivity state; generating audio data in the directivity state obtained by performing an emphasis process on the audio data in the designation direction from the audio collector using audio data collected by the audio collector according to the input of the designation direction; adjusting volume of the generated audio data in a directivity state; and outputting the audio in the non-directivity state collected by the audio collector or the audio in the directivity state after the volume is adjusted.

According to the present disclosure, it is possible to suppress generation of a great difference in volume before and after the emphasis process and improve the convenience to a user by adjusting the volume of the audio after performing the emphasis process on the audio in the designation direction using the audio collected by the microphone array device.

BRIEF DESCRIPTION OF DRAWINGS

FIG. 3A is a diagram illustrating a first example of each volume of non-directional audio and directional audio that are output according to the presence or absence of a process of emphasizing an audio signal in related art;

FIG. 3B is a diagram illustrating a first example of each volume of non-directional audio and directional audio that are output according to the presence or absence of a process of emphasizing an audio signal in a directivity control device in each exemplary embodiment;

FIG. 4A is a diagram illustrating a second example of each volume of non-directional audio and directional audio that are output according to the presence or absence of a process of emphasizing an audio signal in related art;

FIG. 4B is a diagram illustrating a second example of each volume of non-directional audio and directional audio that are output according to the presence or absence of a process of emphasizing an audio signal in a directivity control device in each exemplary embodiment;

FIG. 5A is an external view of an omnidirectional microphone array device;

FIG. 5B is an external view of the omnidirectional microphone array device;

FIG. 5C is an external view of the omnidirectional microphone array device;

FIG. 5D is an external view of the omnidirectional microphone array device;

FIG. 5E is an external view of the omnidirectional microphone array device;

FIG. 6 is an illustrative diagram illustrating an example of a principle of a process of emphasizing audio in a direction θ with respect to audio collected by the omnidirectional microphone array device;

FIG. 9A is a flowchart illustrating an example of an operation procedure regarding pre-setting of a volume adjustment value;

FIG. 17A is a flowchart illustrating respective examples of an operation procedure in an actual operation of an audio processing system of the third exemplary embodiment, and an operation procedure regarding calculation of a volume adjustment value;

FIG. 19A is a flowchart illustrating respective examples of an operation procedure in an actual operation of an audio processing system of the first modification example of the third exemplary embodiment, and an operation procedure regarding calculation of a volume adjustment value;

FIG. 21B is a flowchart illustrating respective examples of an operation procedure in an actual operation of an audio processing system of the second modification example of the third exemplary embodiment, and an operation procedure regarding calculation of a volume adjustment value;

FIG. 25A is a diagram illustrating a first example of frequency characteristics of the volume adjustment coefficient value;

FIG. 25B is a diagram illustrating a second example of frequency characteristics of the volume adjustment coefficient value.

DETAILED DESCRIPTION OF PREFERRED EMBODIMENTS

Hereinafter, each exemplary embodiment of an audio processing system and an audio processing method according to the present disclosure will be described with reference to the drawings. An audio processing system of each exemplary embodiment is used as, for example, a monitoring system (including a manned monitoring system and an unmanned monitoring system) installed at a factory, a public facility (for example, a library or an event hall), or a store (for example, a retail store or a bank), but the present disclosure is not particularly limited. In each exemplary embodiment below, a directivity control system of each exemplary embodiment is described as being installed in, for example, a store.

The present disclosure can also be represented as a method including each operation (step) that is performed by each device (for example, a directivity control device or an omnidirectional microphone array device to be described below) constituting an audio processing system, or each device (for example, a directivity control device or an omnidirectional microphone array device to be described below) constituting a directivity control system.

In the following description, a state in which directivity in a specific direction is not formed for audio data or a state in which an emphasis process has not been performed in a specific direction is defined as a "non-directivity state", and a state in which the directivity in a specific direction is formed for audio data or a state in which an emphasis process is performed in a specific direction is defined as a "directivity state."

Further, in the following description, audio collected in a non-directivity state before the emphasis process is performed is defined as "non-directional audio", and audio collected in a directivity state after the emphasis process is performed is defined as "directional audio."

Overview of Common Operation in Each Exemplary Embodiment

Figure 1A:
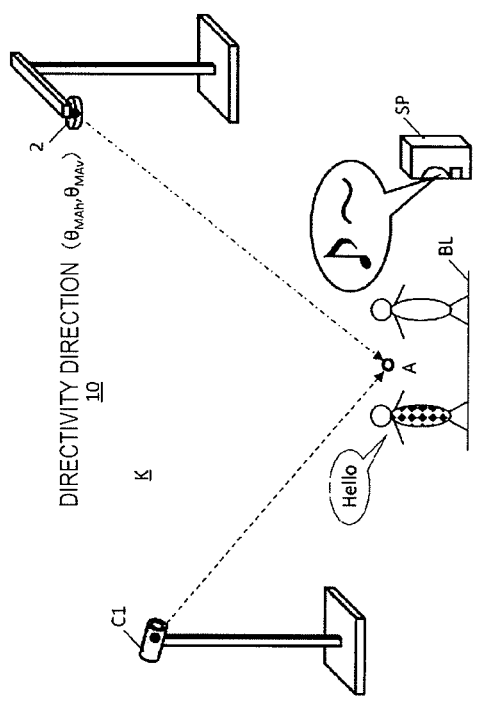
FIG. 1A is a schematic diagram illustrating an overview of an operation of an audio processing system of each exemplary embodiment.
Figure 1B:
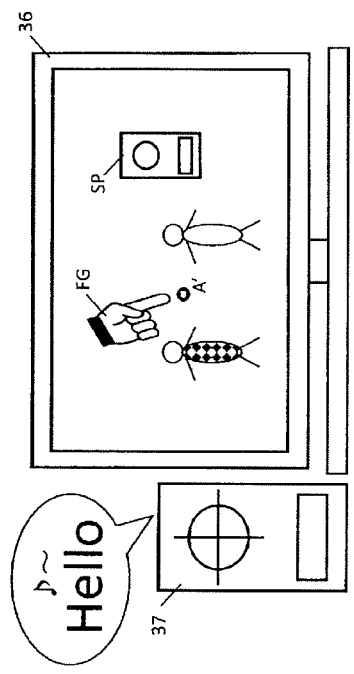
FIG. 1B is a schematic diagram illustrating an overview of an operation of the audio processing system of each exemplary embodiment.

First, an overview of an operation of an audio processing system of each exemplary embodiment will be described with reference to FIGS. 1A and 1B. FIGS. 1A and 1B are schematic diagrams illustrating an overview of an operation of the audio processing system of each exemplary embodiment. In FIG. 1A, for example, a state in which camera device C1 images a target (for example, two persons standing on floor BL) in audio collection area K in which audio processing system 10 of the first exemplary embodiment is installed, and a state in which omnidirectional microphone array device 2 collects a conversation of the targets (two persons) present in a directivity direction from omnidirectional microphone array device 2 and output sound (for example, "♪~") from speaker device SP that is not present in the directivity direction from omnidirectional microphone array device 2 are shown.

In FIG. 1B, a state of an output from speaker device 37 in which the volume of audio data (for example, "Hello") in a directivity direction from omnidirectional microphone array device 2 to audio position A (that is, an actual position; the same applies hereinafter) corresponding to designation position A' designated by finger FG of a user with respect to an image displayed on a screen of image display device 36 is higher than the volume of audio data of an output sound (for example, "♪") from speaker device SP is shown.

In audio processing system 10 illustrated in FIG. 1A, camera device C1 images, for example, a subject (for example, two persons illustrated in FIG. 1A) shown in a range of an angle of view of camera device C1. Omnidirectional microphone array device 2 collects audio around an installation position of omnidirectional microphone array device 2 in audio collection area K. In FIG. 1A, two persons as targets are talking, and "Hello" is an example of conversation content. Image data obtained by the imaging of camera device C1 is displayed on display device 36 of directivity control device 3 illustrated in FIG. 2 (see FIG. 1B), and the two persons and speaker device SP are displayed.

In FIG. 1B, when designation position A' on the image displayed on display device 36 is designated by finger FG of the user, directivity control device 3 calculates coordinates ($\theta_{MAh}$, $\theta_{MAv}$) indicating a directivity direction from the installation position of omnidirectional microphone array device 2 to audio position A using the coordinate data of designation position A'. An example of calculation of the coordinates ($\theta_{MAh}$, $\theta_{MAv}$) indicating the directivity direction and the audio position will be described below in detail.

Further, directivity control device 3 forms directivity of the collected audio in a direction from the installation position of omnidirectional microphone array device 2 to audio position A using the coordinate data of the coordinates ($\theta_{MAh}$, $\propto_{MAv}$) indicating the calculated directivity direction. In other words, directivity control device 3 performs an emphasis process on the audio data in the direction from the installation position of omnidirectional microphone array device 2 to audio position A using the coordinate data of coordinates ($\theta_{MAh}$, $\theta_{MAv}$) indicating the directivity direction. Hereinafter, a process of forming the directivity of the audio data is referred to as "perform an emphasis process on the audio data."

First Exemplary Embodiment

Figure 2:
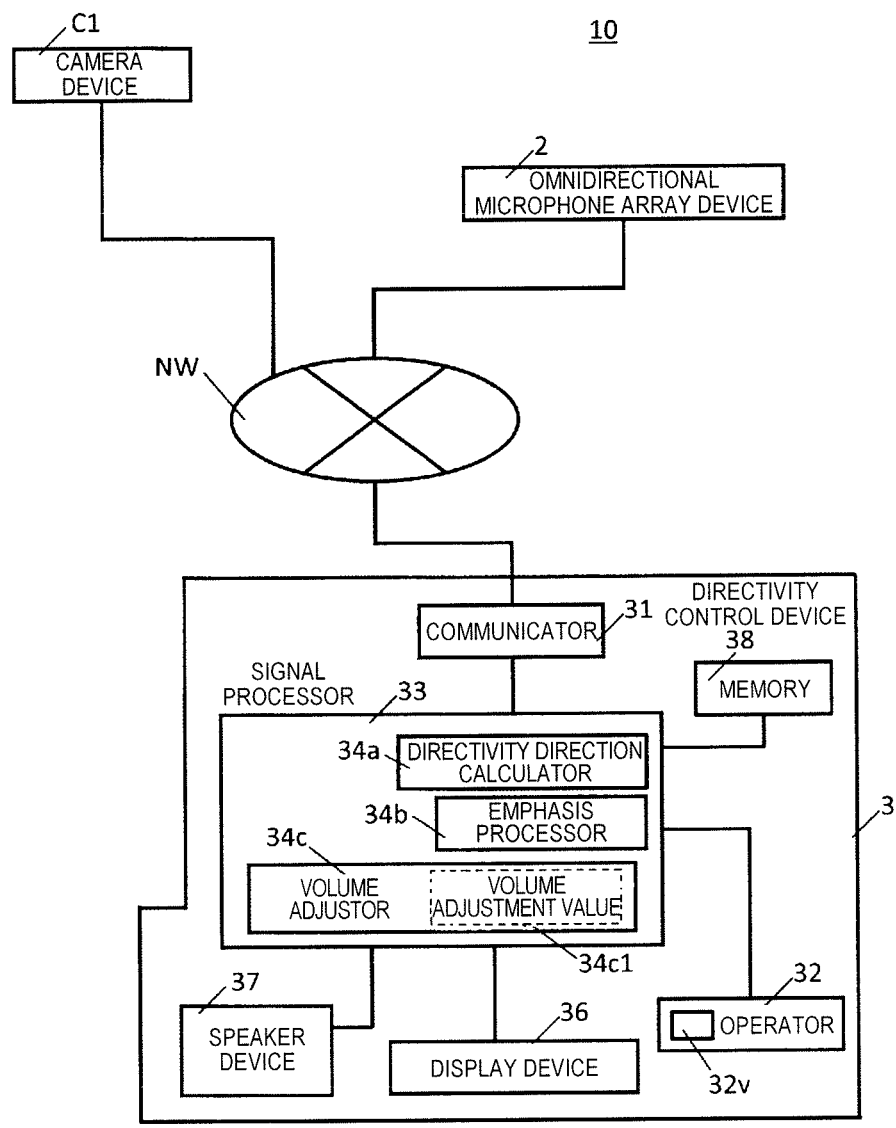
FIG. 2 is a block diagram illustrating an example of a system configuration of an audio processing system of a first exemplary embodiment.

FIG. 2 is a block diagram illustrating an example of a system configuration of audio processing system 10 of a first exemplary embodiment. Audio processing system 10 illustrated in FIG. 2 includes camera device C1, omnidirectional microphone array device 2, and directivity control device 3. In audio processing system 10 illustrated in FIG. 1, omnidirectional microphone array device 2, camera device C1, and directivity control device 3 are connected to each other over network NW. Network NW may be a wired network (for example, intranet or Internet) or may be a wireless network (for example, wireless LAN (Local Area Network)). The same applies to each exemplary embodiment below.

Camera device C1 as an example of an imaging unit is installed to be fixed to, for example, a ceiling of a store. Camera device C1 has, for example, a function of a monitoring camera, and captures an image in an angle of view of camera device C1 using a zoom function (for example, a zoom-in process or a zoom-out process) or an optical axis moving function (panning or tilting) through a remote operation from a central monitoring control room (not shown) connected to network NW.

An installation position or a direction of camera device C1 is registered in memory 38 of directivity control device 3, and control information regarding pan, tilt, and zoom is transmitted to directivity control device 3 at any time, and an association of a positional relationship between an image position and a directivity direction is always performed. Further, when camera device C1 is, for example, an omnidirectional camera, camera device C1 transmits image data indicating an omnidirectional image of audio collection area K (that is, omnidirectional image data), or plane image data generated by performing a predetermined distortion correction process on the omnidirectional image data for panorama conversion to directivity control device 3 over network NW. Hereinafter, for simplicity of description, camera device C1 is described as an omnidirectional camera.

When an arbitrary position is designated on an image displayed on display device 36 (that is, an image obtained through imaging of camera device C1 (hereinafter, referred to as an "output image")) by finger FG of a user, camera device C1 receives coordinate data of designation position A' from directivity control device 3, calculates data of the distance and direction (including a horizontal angle and a vertical angle; the same applies hereinafter) from camera device C1 to a position (hereinafter simply abbreviated as "audio position") in an actual space corresponding to designation position A', and transmits the data to directivity control device 3. Since a process of calculating data of the distance and the direction in camera device C1 is a known technology, description thereof will be omitted.

Omnidirectional microphone array device 2 as an example of an audio collector collects audio in an audio collection area in which omnidirectional microphone array device 2 is installed. For example, omnidirectional microphone array device 2 collects audio (for example, conversation speech of two persons) uttered by a person (see, for example, two persons in FIG. 1A) as an example of a sound source present in the audio collection area.

Omnidirectional microphone array device 2 includes a plurality of microphones that are an example of an audio collection element. Using the plurality of microphones, omnidirectional microphone array device 2 collects audio from a direction of 360° (omnidirectional) about an installation position of omnidirectional microphone array device 2 in a non-directivity state. Therefore, the audio data collected by omnidirectional microphone array device 2 is not subjected to the emphasis process in a specific direction. An example of a housing shape of omnidirectional microphone array device 2 will be described below with reference to FIGS. 5A to 5E.

Omnidirectional microphone array device 2 at least includes microphones 221, 222, 223, . . . , 22($n$−1), and 22$n$ arranged at equal intervals, A/D converters 241, 242, 243, . . . , 24($n$−1), and 24$n$ that convert audio collected by respective microphones 221, 222, 223, . . . , 22($n$−1), and 22$n$ into digital audio signals (audio data), and a controller (not shown) that performs predetermined signal processing on outputs of A/D converters 241, 242, 243, . . . , 24($n$−1), and 24$n$.

Omnidirectional microphone array device 2 transmits an audio packet (not shown) including the audio data collected by respective microphones 221, 222, 223, . . . , 22($n$−1), and 22$n$ to directivity control device 3 over network NW.

Here, an appearance of omnidirectional microphone array device 2 will be described with reference to FIGS. 5A to 5E. FIGS. 5A to 5E are external views of omnidirectional microphone array devices 2, 2A, 2B, 2C, and 2D. Omnidirectional microphone array devices 2, 2A, 2B, 2C, and 2D illustrated in FIGS. 5A to 5E have different appearances, and different arrangement positions of the plurality of microphones, but functions of the respective omnidirectional microphone array devices are the same.

In FIGS. 5A to 5E, for example, non-directional, high sound quality, and small electret condenser microphones (ECMs) are used as the microphones used in respective omnidirectional microphone array devices 2, 2A, 2B, 2C, and 2D. The same applies to exemplary embodiments below.

Omnidirectional microphone array device 2 illustrated in FIG. 5A has disc-shaped housing 21. In housing 21, a plurality of microphones 22$i$ and 23$i$ (i:1 to n; n indicates the number of microphones used in the omnidirectional microphone array device; the same applies hereinafter) are arranged in a concentric shape. Specifically, a plurality of microphones 22$i$ are arranged in a concentric shape along a large circular shape having the same center as housing 21, and a plurality of microphones 23i are arranged in a concentric shape along a small circular shape having the same center as housing 21. The plurality of microphones 22i have a great distance therebetween, a great diameter, and characteristics suitable for a low audio range. On the other hand, the plurality of microphones 23i have a small distance therebetween, a small diameter, and characteristics suitable for a high audio range.

Omnidirectional microphone array device 2A illustrated in FIG. 5B includes disc-shaped housing 21. In housing 21, a plurality of microphones 22i are arranged on straight lines at uniform intervals. Further, a center of the plurality of microphones 22i arranged in the vertical direction and a center of the plurality of microphones 22i arranged in the horizontal direction are arranged to intersect each other at a center of housing 21. Since the plurality of microphones 22i are arranged on the vertical and horizontal straight lines in omnidirectional microphone array device 2A, it is possible to reduce an amount of calculation in the process of emphasizing the audio data. The plurality of microphones 22i may be arranged only on one line in the vertical direction or the horizontal direction.

Omnidirectional microphone array device 2B illustrated in FIG. 5C has disc-shaped housing 21C having a smaller diameter than omnidirectional microphone array device 2 illustrated in FIG. 5A. In housing 21C, a plurality of microphones 23i are uniformly arranged along a circumferential direction. Omnidirectional microphone array device 2B illustrated in FIG. 5C has a small distance between respective microphones 23i, and characteristics suitable for a high audio range.

Omnidirectional microphone array device 2C illustrated in FIG. 5D has housing 21D having a donut shape or a ring shape in which opening 21a having a predetermined size is formed at a housing center. In housing 21D, a plurality of microphones 22i are arranged in a concentric shape at uniform intervals in a circumferential direction of housing 21D.

Omnidirectional microphone array device 2E illustrated in FIG. 5E has rectangular housing 21E. In housing 21E, a plurality of microphones 22i are arranged at uniform intervals along an outer circumferential direction of housing 21E. In omnidirectional microphone array device 2D illustrated in FIG. 5E, housing 21E is formed in a rectangular shape, and thus, omnidirectional microphone array device 2D can be easily installed at a place such as a corner.

Directivity control device 3 may be, for example, a stationary PC (Personal Computer) installed in a central monitoring control room (not shown), or may be a data communication terminal such as a portable phone, a tablet terminal, or a smart phone that can be carried by a user.

Directivity control device 3 includes at least communicator 31, operator 32, signal processor 33, display device 36, speaker device 37, and memory 38. Signal processor 33 includes at least directivity direction calculator 34a, emphasis processor 34b, and volume adjustor 34c.

Communicator 31 receives packet PKT transmitted from omnidirectional microphone array device 2 over network NW, and outputs packet PKT to signal processor 33.

Operator 32 is a user interface (UI) for notifying signal processor 33 of content of an operation of the user. For example, operator 32 is a pointing device such as a mouse or a keyboard. Operator 32, for example, is arranged corresponding to a screen of display device 36. Operator 32 may be configured using a touch panel or a touch pad that can be operated by finger FG of the user or a stylus pen.

Operator 32 acquires coordinate data indicating a position (that is, a position in which volume of audio data output from speaker device 37 is desired to be increased or decreased) designated by an operation of the user with respect to the image displayed on display device 36 (that is, an image captured by camera device C1; the same applies hereinafter), and outputs the coordinate data to signal processor 33.

Volume operator 32v receives an input operation for further changing the volume of the audio data in a directivity state (to be described below) adjusted by volume adjustor 34c according to a user's preference, and notifies signal processor 33 of information regarding the volume input by the input operation. Signal processor 33 further changes the volume of the audio data in a directivity state adjusted by volume adjustor 34c according to the operation of volume operator 32v, and the same applies to each exemplary embodiment below.

Signal processor 33 includes, for example, a CPU (Central Processor), an MPU (Micro Processor), or a DSP (Digital Signal Processor), and performs a control process of generally controlling an operation of each unit of directivity control device 3, a process of inputting and outputting data to and from each other unit, a data operation (calculation) process, and a data storage process.

For example, signal processor 33 controls the operation of display device 36 and speaker device 37, for example, to display the image data transmitted from camera device C1 on display device 36 and output the audio data included in the audio packet transmitted from omnidirectional microphone array device 2 from speaker device 37 according to a user operation.

Directivity direction calculator 34a calculates coordinates ($\theta_{mAh}$, $\theta_{mAv}$) indicating a directivity direction from omnidirectional microphone array device 2 to audio position A corresponding to designation position A' according to a position designation operation of the user from the image displayed on display device 36. Since a specific calculation method of directivity direction calculator 34a is a known technology as described above, a detailed description thereof will be omitted.

Directivity direction calculator 34a calculates the coordinates ($\theta_{mAh}$, $\theta_{MAv}$) indicating a directivity direction from the installation position of omnidirectional microphone array device 2 to audio position A using data of a distance and a direction from the installation position of camera device C1 to audio position A. For example, when a housing of omnidirectional microphone array device 2 and camera device C1 are integrally attached to surround a housing of camera device C1, a direction (a horizontal angle and a vertical angle) from camera device C1 to audio position A can be used as the coordinates ($\theta_{MAh}$, $\theta_{MAv}$) indicating the directivity direction from omnidirectional microphone array device 2 to audio position A.

When the housing of camera device C1 and the housing of omnidirectional microphone array device 2 are mounted to be separate, directivity direction calculator 34a calculates the coordinates ($\theta_{MAh}$, $\theta_{MAv}$) indicating the directivity direction from omnidirectional microphone array device 2 to audio position A using data of a calibration parameter calculated in advance, and data of a direction (horizontal angle and vertical angle) from camera device C1 to audio position A. The calibration is an operation of calculating or acquiring a predetermined calibration parameter necessary for directivity direction calculator 34a of directivity control device 3 to calculate the coordinates ($\theta_{MAh}$, $\theta_{MAv}$) indicating the directivity direction, and is assumed to have been performed using a known technology in advance.

Among the coordinates ($\theta_{MAh}$, $\theta_{MAv}$) indicating the directivity direction, $\theta_{MAh}$ indicates the horizontal angle of the directivity direction from omnidirectional microphone array device 2 to audio position A, and $\theta_{MAv}$ indicates the vertical angle of the directivity direction from omnidirectional microphone array device 2 to audio position A. Audio position A is a position of a site that is an actual monitoring target or audio collection target corresponding to designation position A' designated in operator 32 by finger FG of the user or a stylus pen in the image displayed on display device 36 (see FIG. 1A).

Emphasis processor 34b performs an emphasis process on the audio data in the directivity direction indicated by coordinates ($\theta_{MAh}$, $\theta_{MAv}$) indicating the directivity direction calculated by directivity direction calculator 34a using the audio data included in the audio packet transmitted from omnidirectional microphone array device 2, to generate audio data in a directivity state after the emphasis process. In other words, emphasis processor 34b forms directivity of the audio data in the directivity direction indicated by coordinates ($\theta_{MAh}$, $\theta_{MAv}$) indicating the directivity direction calculated by directivity direction calculator 34a using the audio data included in the audio packet transmitted from omnidirectional microphone array device 2. The emphasis process in emphasis processor 34b may be performed by, for example, omnidirectional microphone array device 2.

Volume adjustor 34c performs adjustment to add or subtract the volume of the audio data in a directivity state subjected to the emphasis process by emphasis processor 34b using volume adjustment value 34c1 defined in the operation of volume adjustor 34c in advance. Signal processor 33 outputs the audio data after the volume is adjusted by volume adjustor 34c from speaker device 37.

Display device 36 as an example of a display displays, for example, image data transmitted from camera device C1 on a screen under control of signal processor 33 according to an operation of the user.

Speaker device 37 as an example of an audio output outputs audio data (in other words, audio data in a non-directivity state) included in the audio packet transmitted from omnidirectional microphone array device 2, or audio data after the volume is adjusted by volume adjustor 34c. Display device 36 and speaker device 37 may be separate from directivity control device 3.

Memory 38 as an example of the storage includes, for example, a RAM (Random Access Memory), functions as a work memory at the time of an operation of each unit of directivity control device 3, and stores data required at the time of operation of each unit of directivity control device 3.

FIG. 6 is an illustrative diagram illustrating an example of a principle of a process of emphasizing audio in a direction θ with respect to audio collected by omnidirectional microphone array device 2. A principle of a directivity forming process using, for example, a delay and sum scheme will be briefly described with reference to FIG. 6. Sound waves emitted from sound source 80 are incident on respective microphones 221, 222, 223, ..., 22(n–1), and 22n embedded in omnidirectional microphone array device 2 at a certain angle (incidence angle=(90–θ)[°]). The incidence angle θ illustrated in FIG. 6 may be a horizontal angle $\theta_{MAh}$ or a vertical angle $\theta_{MAv}$ in an audio collection direction from omnidirectional microphone array device 2 to the audio position.

Sound source 80 is, for example, a subject (for example, any person illustrated in FIG. 1A) of camera device C1 that is present in a direction in which omnidirectional microphone array device 2 collects the audio. Sound source 80 is present in a direction of a predetermined angle θ with respect to a surface of housing 21 of omnidirectional microphone array device 2. Further, distances d between microphones 221, 222, 223, ..., 22(n–1), and 22n are constant.

Sound waves emitted from sound source 80 first reach microphone 221 and are collected by microphone 221, and then reach microphone 222 and are collected by microphone 222. Similarly, the sound waves are successively collected. Lastly, the sound waves arrive at microphone 22n and are collected by microphone 22n.

For example, when sound source 80 is audio during conversation of a person, a direction from positions of respective microphones 221, 222, 223, ..., 22(n–1), and 22n of omnidirectional microphone array device 2 to sound source 80 is the same as a direction from each microphone of omnidirectional microphone array device 2 to the audio position corresponding to the designation position designated on the screen of display device 36 by the user.

Here, arrival time differences τ1, τ2, τ3, ..., τ(n–1) are generated from a time at which the sound waves arrive at microphones 221, 222, 223, ..., 22(n–1) to a time at which the sound waves arrive at microphone 22n collecting the sound waves last. Therefore, when the audio data collected by respective microphones 221, 222, 223, ..., 22(n–1), and 22n is added as it is, the audio data is added with a shifted phase, and thus, a volume level of the sound waves decreases on the whole.

τ1 is a time of a difference between a time at which the sound waves arrive at microphone 221 and a time at which the sound waves arrive at microphone 22n, τ2 is a time of a difference between a time at which the sound waves arrive at microphone 222 and the time at which the sound waves arrive at microphone 22n, and similarly, τ(n–1) is a time of a difference between a time at which the sound waves arrive at microphone 22(n–1) and the time at which the sound waves arrive at microphone 22n.

In the emphasis process of the present exemplary embodiment, in A/D converters 241, 242, 243, ..., 24(n–1), and 24n provided corresponding to respective microphones 221, 222, 223, ..., 22(n–1), and 22n, an analog audio signal is converted into a digital audio signal. Further, in delay units 251, 252, 253, ..., 25(n–1), and 25n provided corresponding to respective microphones 221, 222, 223, ..., 22(n–1), and 22n, a predetermined delay time is added to the digital audio signals. Outputs of respective delay units 251, 252, 253, ..., 25(n–1), and 25n are added by adder 26. Respective delay units 251, 252, 253, ..., 25(n–1), and 25n and adder 26 may be provided in emphasis processor 34b, or may be provided in omnidirectional microphone array device 2 when the emphasis process is performed by omnidirectional microphone array device 2.

Further, in the emphasis process illustrated in FIG. 6, delay units 251, 252, 253, ..., 25(n–1), and 25n apply a delay time corresponding to the arrival time differences in respective microphones 221, 222, 223, ..., 22(n–1), and 22n, and align phases of the sound waves. Then, the audio data after a delay process is added by adder 26. Accordingly, emphasis processor 34b or omnidirectional microphone array device 2 can emphasize the audio in the direction of the angle θ with respect to the audio collected by respective microphones 221, 222, 223, ..., 22(n–1), and 22n.

For example, in FIG. 6, delay times D1, D2, D3, ..., D(n–1), and Dn applied in delay units 251, 252, 253, ..., 25(n–1), and 25n correspond to arrival time differences τ1, τ2, τ3, ..., τ(n–1), respectively, and are shown in Equation $$D1 = \frac{L1}{Vs} = \frac{\{d \times (n-1) \times \cos\theta\}}{Vs} \quad (1)$$

$$D2 = \frac{L2}{Vs} = \frac{\{d \times (n-2) \times \cos\theta\}}{Vs}$$

$$D3 = \frac{L3}{Vs} = \frac{\{d \times (n-3) \times \cos\theta\}}{Vs},$$

$$\ldots,$$

$$Dn-1 = \frac{Ln-1}{Vs} = \frac{\{d \times 1 \times \cos\theta\}}{Vs}$$

$$Dn = 0$$

L1 is a difference between the sound wave arrival distances in microphone 221 and microphone 22n. L2 is a difference between the sound wave arrival distances in microphone 222 and microphone 22n. L3 is a difference between the sound wave arrival distances in microphone 223 and microphone 22n. Similarly, L(n−1) is a difference between the sound wave arrival distances in microphone 22(*n*−1) and microphone 22n. Vs is audio speed of sound waves. This audio speed Vs may be calculated by omnidirectional microphone array device 2, or may be calculated by directivity control device 3 (which will be described below). L1, L2, L3, . . . , L(n−1) are known values. In FIG. 6, delay time Dn set in delay unit 25n is 0 (zero).

Thus, emphasis processor 34b or omnidirectional microphone array device 2 can easily emphasize the audio in any direction for the audio collected by respective microphones 221, 222, 223, . . . , 22(*n*−1), and 22n by changing delay times D1, D2, D3, . . . , D(n−1), and Dn applied in delay units 251, 252, 253, . . . , 25(*n*−1), and 25n.

(Effects of Emphasis Process and Volume Adjustment on Volume)

Next, effects of the emphasis process and the volume adjustment on the volume of the audio data in an audio processing system of each exemplary embodiment will be described with reference to FIGS. 3A and 3B and FIGS. 4A and 4B. FIG. 3A is a diagram illustrating a first example of volume of non-directional audio and directional audio that are output according to the presence or absence of a conventional process of emphasizing an audio signal. FIG. 3B is a diagram illustrating a first example of volume of non-directional audio and directional audio that are output according to the presence or absence of a process of emphasizing an audio signal in directivity control device 3 of each exemplary embodiment.

In the related art illustrated in FIG. 3A, the audio (non-directional audio) collected by the microphone array is shown as waveform WV1. When the non-directional audio is selected in switching of signal processing (that is, switching between the non-directional audio and the directional audio that are output dependent on the presence or absence of the emphasis process; the same applies hereinafter), audio corresponding to waveform WV1 of the non-directional audio is output from the speaker device.

However, when the directional audio is selected in switching of signal processing, audio corresponding to waveform WV2 after waveform WV1 of the non-directional audio is subjected to the emphasis process is output from the speaker device. Therefore, when the emphasis process of a delay and sum scheme illustrated in FIG. 6 is performed, the audio signal (non-directional audio signal) for each microphone is simply added through the emphasis process, the volume of the directional audio is higher than the volume of non-directional audio, and the volume of the non-directional audio (see waveform WV1) is different from the volume of the directional audio (see waveform WV2).

Meanwhile, in each exemplary embodiment illustrated in FIG. 3B, audio (non-directional audio) collected by omnidirectional microphone array device 2 is shown as waveform WV1. When the non-directional audio is selected in switching of signal processing, audio corresponding to waveform WV1 of the non-directional audio is output from speaker device 37, similarly to FIG. 3A.

However, when the directional audio is selected in switching of signal processing, the volume adjustment process is performed on waveform WV2 after the non-directional audio of waveform WV2 is subjected to the emphasis process, and thus, audio corresponding to waveform WV3 after the volume is adjusted is output from speaker device 37. Therefore, when the emphasis process of a delay and sum scheme illustrated in FIG. 6 is performed, an audio signal for each microphone (a signal of the non-directional audio) is simply added through the emphasis process, and the volume of the directional audio is greater than the volume of the non-directional audio, but the volume of the non-directional audio (see waveform WV1) and the volume of the directional audio (see waveform WV3) are substantially the same due to the volume adjustment process.

FIG. 4A is a diagram illustrating a second example of each volume of non-directional audio and directional audio that are output according to the presence or absence of a conventional process of emphasizing an audio signal. FIG. 4B is a diagram illustrating a second example of each volume of non-directional audio and directional audio that are output according to the presence or absence of a process of emphasizing an audio signal in directivity control device 3 of each exemplary embodiment.

In the related art illustrated in FIG. 4A, audio (non-directional audio) collected by a microphone array is shown as waveform WV1. When the non-directional audio is selected in switching of signal processing, audio corresponding to waveform WV1 of the non-directional audio is output from a speaker device.

However, when the directional audio is selected in switching of signal processing, the averaging process according to the number of microphones constituting the microphone array is performed on waveform WV2 after the non-directional audio of waveform WV1 is subjected to the emphasis process, and thus, audio corresponding to waveform WV4 indicating the output after the averaging process is output from the speaker device. Therefore, when the emphasis process of a delay and sum scheme illustrated in FIG. 6 is performed, an audio signal for each microphone (a signal of the non-directional audio) is added through the emphasis process, and the averaging process according to the number of microphones is performed. As a result, the volume of the directional audio is lower than the volume of the non-directional audio, and the volume of the non-directional audio (see waveform WV1) and the volume of the directional audio (see waveform WV4) are different from each other.

On the other hand, in the exemplary embodiment illustrated in FIG. 4B, the audio (non-directional audio) collected by omnidirectional microphone array device 2 is shown as waveform WV1. When the non-directional audio is selected in switching of signal processing, audio corresponding to waveform WV1 of the non-directional audio is output from speaker device 37, similar to FIG. 4A.

However, when the directional audio is selected in switching of the signal processing, the averaging process according to the number of microphones constituting the microphone array is performed on waveform WV2 after the non-directional audio of waveform WV2 is subjected to the emphasis process, and the volume adjustment process is performed on the audio after the averaging process, and thus, audio corresponding to waveform WV5 after the volume is adjusted is output from speaker device 37. Therefore, when the emphasis process of a delay and sum scheme illustrated in FIG. 6 is performed, an audio signal for each microphone (a signal of the non-directional audio) is added through the emphasis process, and the averaging process according to the number of microphones is performed. As a result, the volume of the directional audio is lower than the volume of the non-directional audio, but the volume of the non-directional audio (see waveform WV1) and the volume of the directional audio (see waveform WV5) are substantially the same through the volume adjustment process.

Figure 7:
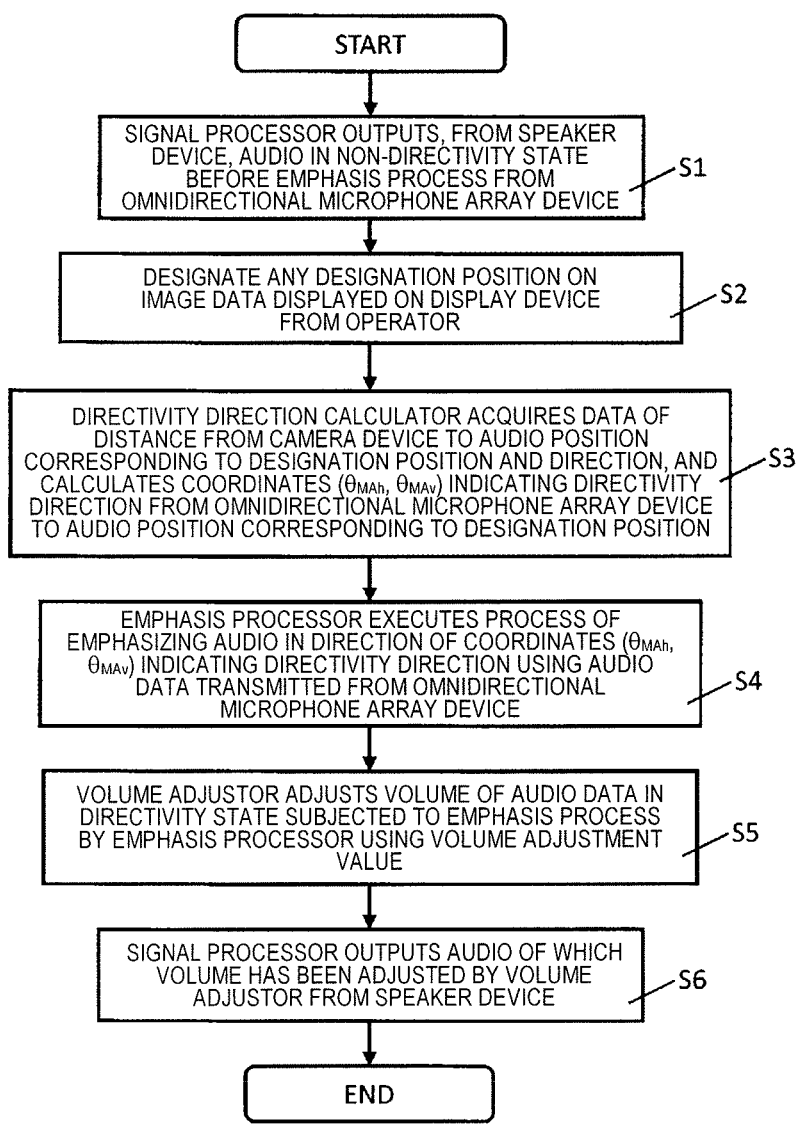
FIG. 7 is a flowchart illustrating an example of an operation procedure in an actual operation of the audio processing system of the first exemplary embodiment.

Next, an operation procedure in an actual operation of audio processing system 10 of the present exemplary embodiment will be described with reference to FIG. 7. FIG. 7 is a flowchart illustrating an example of an operation procedure in an actual operation of audio processing system 10 of the first exemplary embodiment. In the following description, the time of an actual operation of the audio processing system indicates, for example, a state in which audio is actually collected in an audio collection area in which omnidirectional microphone array device 2 is installed.

In FIG. 7, omnidirectional microphone array device 2 transmits an audio packet including the audio data of the audio collected by each microphone to directivity control device 3. Further, camera device C1 transmits an image packet including image data obtained through imaging to directivity control device 3. Signal processor 33 outputs audio (non-directional audio) in a non-directivity state before an emphasis process included in the audio packet transmitted from omnidirectional microphone array device 2 from speaker device 37 (S1), and displays the image data included in the image packet transmitted from camera device C1 on display device 36.

It is assumed that after step S1, any designation position A' on the image data displayed on display device 36 is designated, for example, from operator 32 according to an input operation of the user as one or more designation directions for audio emphasis for switching from a non-directivity state to a directivity state (S2).

In this case, directivity direction calculator 34a acquires data of a distance and a direction (horizontal angle and vertical angle) from camera device C1 to audio position A corresponding to designation position A', and calculates the coordinates ($\theta_{MAh}$, $\theta_{MAv}$) indicating a directivity direction (designation direction) from omnidirectional microphone array device 2 to audio position A corresponding to designation position A' using this data (S3). A process of calculating the coordinates ($\theta_{MAh}$, $\theta_{MAv}$) indicating a directivity direction in directivity direction calculator 34a as described above is a known technology, and thus, detailed description thereof will be omitted. Directivity direction calculator 34a may acquire the coordinates indicating a direction of audio position (source location) A from camera device C1, instead of the data of the distance and the direction (horizontal angle and vertical angle) to audio position A corresponding to designation position A', and calculate coordinates ($\theta_{MAh}$, $\theta_{MAv}$) indicating the directivity direction (designation direction) from omnidirectional microphone array device 2 to audio position A corresponding to designation position A' using this data.

After step S3, emphasis processor 34b performs the process of emphasizing the audio in the direction of coordinates ($\theta_{MAh}$, $\theta_{MAv}$) indicating the directivity direction using the audio data included in the audio packet transmitted from omnidirectional microphone array device 2, and generates the audio data in a directivity state after the emphasis process (S4). In the audio emphasis process in step S4, for example, a delay and sum scheme illustrated in FIG. 6 can be used.

After step S4, volume adjustor 34c performs adjustment to add or subtract the volume of the audio data in a directivity state subjected to the emphasis process by emphasis processor 34b using volume adjustment value 34c1 that is defined in the operation of volume adjustor 34c in advance (S5).

For example, as illustrated in FIG. 3B, when the process of averaging the volume according to the number of microphones is not performed, for example, by emphasis processor 34b, volume adjustor 34c performs adjustment to subtract volume adjustment value 34c1 from the volume of the audio data in a directivity state in step S5. On the other hand, as illustrated in FIG. 4B, when the process of averaging the volume according to the number of microphones is performed, for example, by emphasis processor 34b, volume adjustor 34c performs adjustment to add volume adjustment value 34c1 to the volume of the audio data in a directivity state in step S5.

Signal processor 33 outputs the audio of which the volume is adjusted by volume adjustor 34c from speaker device 37 (S6).

Thus, in audio processing system 10 of the present exemplary embodiment, omnidirectional microphone array device 2 collects the audio in a non-directivity state using a plurality of microphones 22i. Operator 32 receives an input of one or more designation directions for audio emphasis for switching from a non-directivity state to a directivity state. When the designation direction (designation position A') is input by operator 32, emphasis processor 34b generates the audio data in a directivity state obtained by performing the emphasis process on the audio data in the designation direction from omnidirectional microphone array device 2 using the collected audio data. Volume adjustor 34c adjusts the volume of the audio data in a directivity state after the emphasis process using fixed volume adjustment value 34c1. Speaker device 37 outputs the audio in a non-directivity state or the audio in a directivity state after the volume is adjusted.

Accordingly, audio processing system 10 adjusts the volume of the audio data after performing the emphasis process on the audio data in the designation direction using the audio collected by omnidirectional microphone array device 2, and thus, can suppress an increase in the difference between the volume of the audio data in a non-directivity state and the volume of audio data in a directivity state after the volume is adjusted (see, for example, FIG. 3B or 4B). Further, since audio processing system 10 can prevent the volume of the audio data from greatly increasing or decreasing upon switching from the non-directivity state to the directivity state, it is possible to avoid the user performing volume adjustment each time, and improve the convenience of work of the user (for example, monitoring service).

When an operation of releasing input of the designation direction (for example, releasing of the operation of designating designation position A') is performed, audio processing system 10 may perform adjustment to the volume of the audio data in a non-directivity state before the emphasis process by subtracting or adding volume adjustment value 34c1 from or to the volume of the audio data in a directivity state after the emphasis process. That is, audio processing system 10 performs adjustment from the volume of the audio data in a directivity state after the emphasis process to the volume of the audio data in a non-directivity state before the emphasis process using volume adjustment value 34c1, as opposed to a case in which the operation of inputting the designation direction is performed. Thus, audio processing system 10 can suppress a great increase or decrease in the volume of the audio when switching is performed from the directivity state to the non-directivity state.

Further, since audio processing system 10 of the present exemplary embodiment adjusts the volume of the audio data in a directivity state using predetermined (fixed) volume adjustment value 34c1 determined by volume adjustor 34c in advance, for example, the fixed volume adjustment value 34c1 which is a constant guideline can be determined according to an installation environment of audio processing system 10 in advance to easily adjust the volume of the audio data in a directivity state.

Second Exemplary Embodiment

Figure 8:
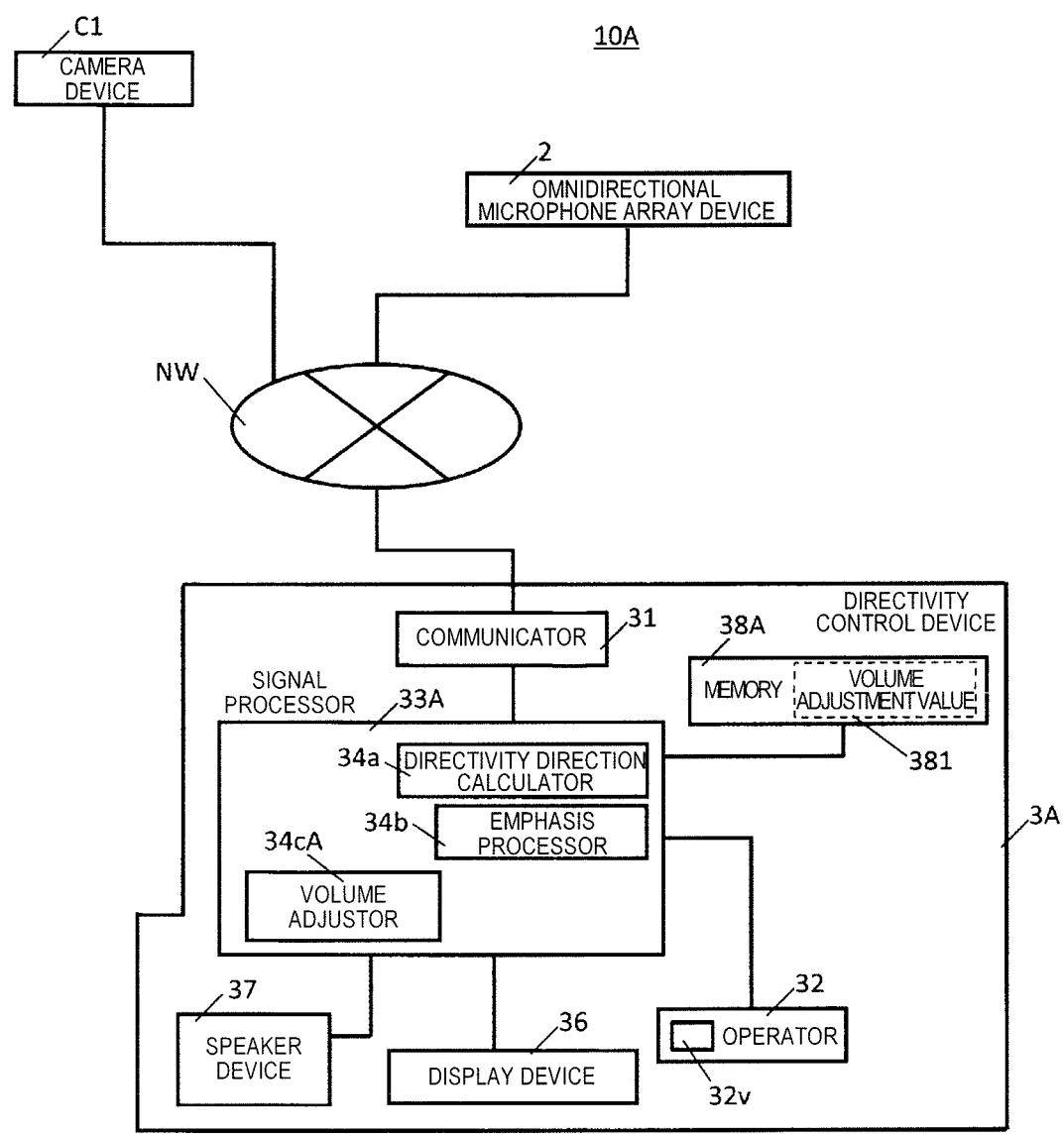
FIG. 8 is a block diagram illustrating an example of a system configuration of an audio processing system of a second exemplary embodiment.

In a second exemplary embodiment, signal processor 33A stores a value input from operator 32 according to an input operation of a user with respect to a predetermined volume adjustment value setting screen (not shown) in memory 38A as volume adjustment value 381 (see FIG. 8). FIG. 8 is a block diagram illustrating an example of a system configuration of audio processing system 10A of the second exemplary embodiment. In audio processing system 10A illustrated in FIG. 8, directivity control device 3 is replaced with directivity control device 3A, and other components are the same, as compared to audio processing system 10 illustrated in FIG. 1. Accordingly, description of the same content will be simplified or omitted, and different content will be described.

Volume adjustor 34cA adjusts the volume of the audio data in a directivity state subjected to the emphasis process by emphasis processor 34b using volume adjustment value 381 stored in memory 38A. Since a volume adjustment method using volume adjustment value 381 is the same as in the first exemplary embodiment, detailed description thereof will be omitted.

Figure 9B:
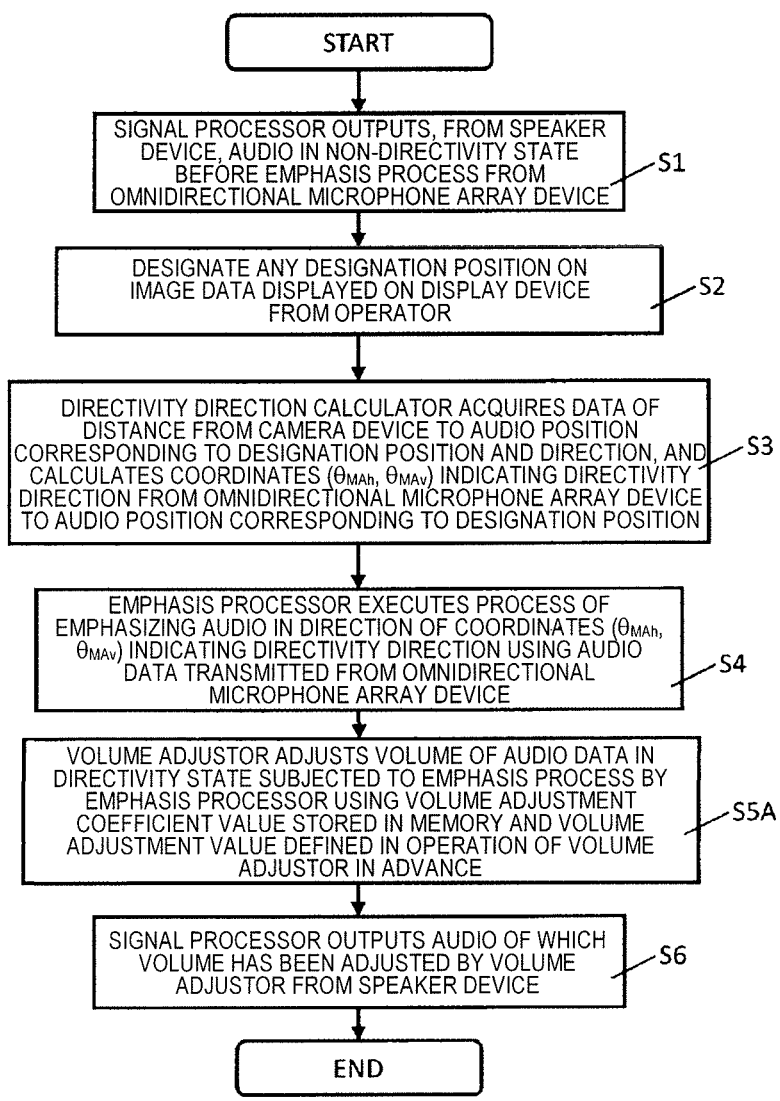
FIG. 9B is a flowchart illustrating an example of an operation procedure in an actual operation of an audio processing system of the second exemplary embodiment.

Next, an operation procedure of audio processing system 10A of the present exemplary embodiment will be described with reference to FIGS. 9A and 9B. FIG. 9A is a flowchart illustrating an example of an operation procedure for pre-setting of volume adjustment value 381. FIG. 9B is a flowchart illustrating an example of an operation procedure in an actual operation of audio processing system 10A of the second exemplary embodiment. In FIG. 9B, since the same processes as the respective processes in FIG. 7 corresponding to audio processing system 10 of the first exemplary embodiment are denoted with the same step numerals, description thereof will be simplified or omitted, and different content will be described.

In FIG. 9A, when an instruction to call for a volume adjustment value setting screen is received from operator 32 according to an input operation of the user (S11), signal processor 33A displays the volume adjustment value setting screen on display device 36 according to the instruction from operator 32. When volume adjustment value 381 is input from operator 32 according to the input operation of the user, signal processor 33A writes and stores input volume adjustment value 381 in memory 38A (S12). Thus, a process of pre-setting volume adjustment value 381 in memory 38A ends.

In FIG. 9B, following step S4, volume adjustor 34cA adjusts the volume of the audio data in a directivity state subjected to the emphasis process by emphasis processor 34b using volume adjustment value 381 stored in memory 38A through the pre-setting process illustrated in FIG. 9A (S5A). Since a process subsequent to step S5A is the same as step S6 illustrated in FIG. 7, a description thereof will be omitted.

Thus, audio processing system 10A according to the present exemplary embodiment reads volume adjustment value 381 input for the predetermined volume adjustment value setting screen from memory 38A, and adjusts the volume of the audio data in a directivity state after the emphasis process using volume adjustment value 381. Accordingly, it is possible to easily adjust the volume of the audio data in a directivity state. Further, since volume adjustment value 381 is written to memory 38A, it is also possible to appropriately change volume adjustment value 381 (for example, during actual operation) according to a change in an installation environment of audio processing system 10A.

First Modification Example of Second Exemplary Embodiment

Figure 10A:
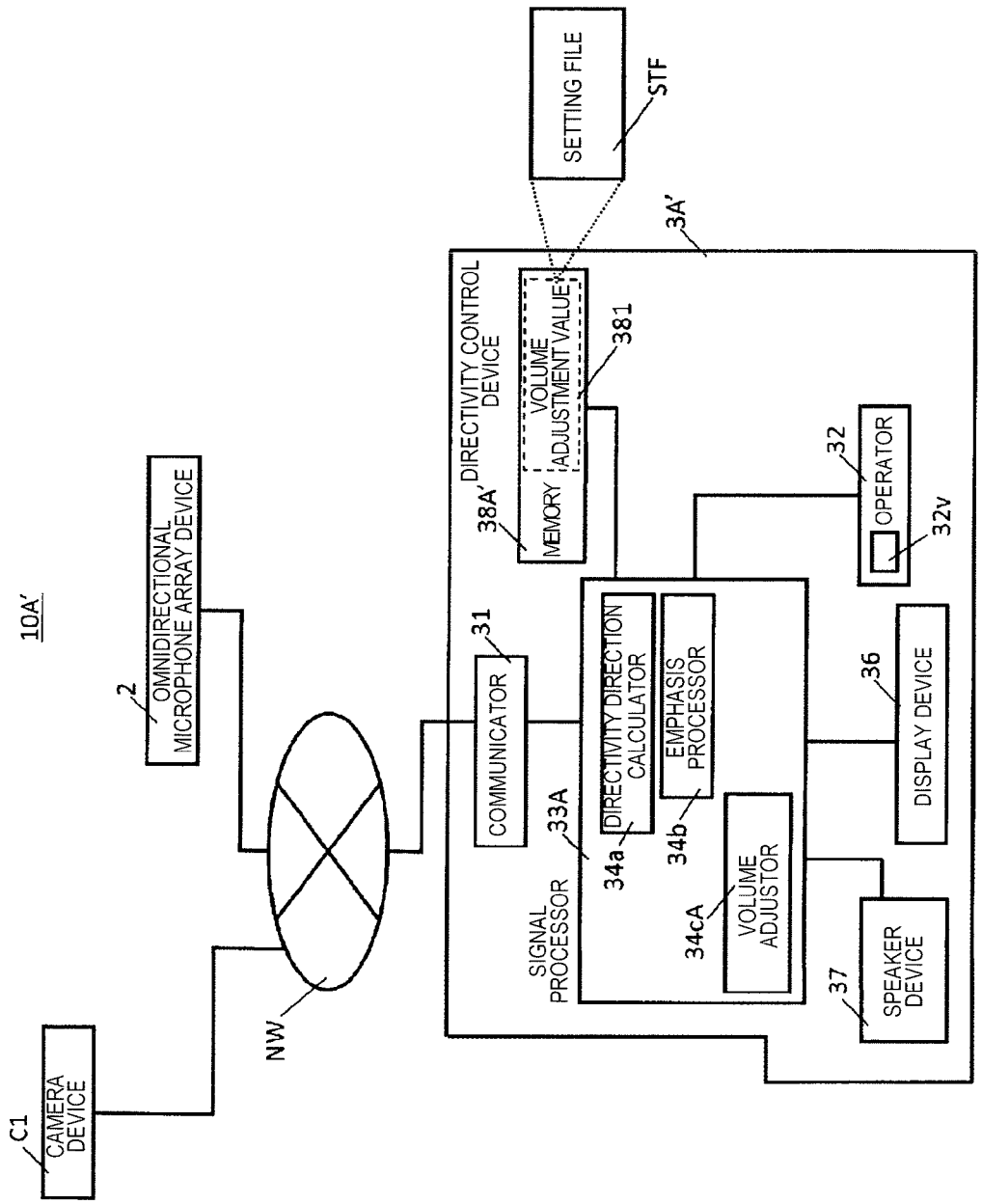
FIG. 10A is a block diagram illustrating an example of a system configuration of an audio processing system of a first modification example of the second exemplary embodiment.

In a first modification example of the second exemplary embodiment, signal processor 33A stores a setting file to which a predetermined volume adjustment value is written in memory 38A' (see FIG. 10A). FIG. 10A is a block diagram illustrating an example of a system configuration of audio processing system 10A' of the first modification example of the second exemplary embodiment. In audio processing system 10A' illustrated in FIG. 10A, directivity control device 3 is replaced with directivity control device 3A', and other components are the same, as compared to audio processing system 10 illustrated in FIG. 1. Accordingly, description of the same content is simplified or omitted, and different content will be described.

Volume adjustor 34cA adjusts the volume of the audio data in a directivity state subjected to the emphasis process by emphasis processor 34b using volume adjustment value 381 written to setting file STF stored in memory 38A'. Since a volume adjustment method using volume adjustment value 381 is the same as in the first exemplary embodiment, detailed description thereof will be omitted.

Figure 10B:
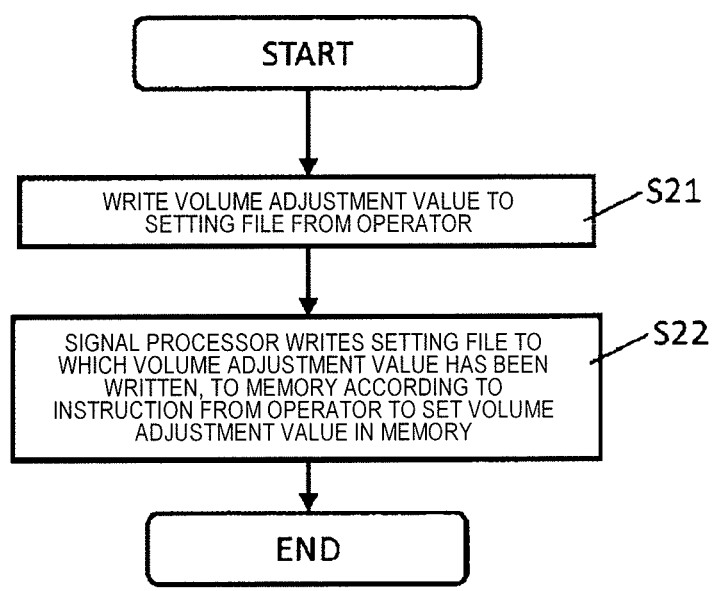
FIG. 10B is a flowchart illustrating an example of an operation procedure regarding pre-setting of a volume adjustment value.

Next, an operation procedure regarding pre-setting of volume adjustment value 381 in audio processing system 10A' of the present exemplary embodiment will be described with reference to FIG. 10B. FIG. 10B is a flowchart illustrating an example of an operation procedure regarding pre-setting of the volume adjustment value. In the first modification example of the second exemplary embodiment, an operation procedure in an actual operation of audio processing system 10A' is the same as the operation procedure in the actual operation of audio processing system 10A of the second exemplary embodiment (see FIG. 9B), and thus, a description thereof is omitted.

In FIG. 10B, volume adjustment value 381 is written to setting file STF from operator 32 according to an input operation of the user (S21), and signal processor 33A writes setting file STF to which volume adjustment value 381 is written, to memory 38A' according to the instruction from operator 32 to set volume adjustment value 381 in memory

38A' (S22). Thus, a process of pre-setting volume adjustment value 381 in memory 38A' ends.

Thus, audio processing system 10A' of the first modification example of the second exemplary embodiment reads setting file STF to which predetermined volume adjustment value 381 is written from memory 38A' and adjusts the volume of the audio data in a directivity state after the emphasis process. Accordingly, it is possible to easily adjust the volume of the audio data in a directivity state. Further, since setting file STF to which volume adjustment value 381 is written is written to memory 38A', it is also possible to change volume adjustment value 381 appropriately (for example, during the actual operation) according to a change in an installation environment of audio processing system 10A'.

Second Modification Example of Second Exemplary Embodiment

Figure 11A:
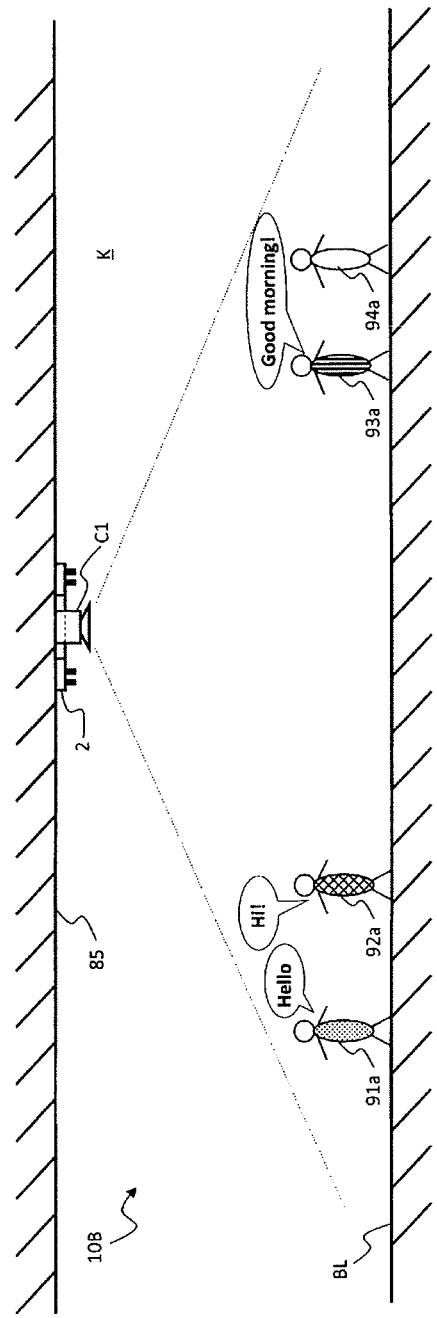
FIG. 11A is a diagram illustrating an example of a state in audio collection of an audio collection area in which the audio processing system of a second modification example of the second exemplary embodiment is installed.
Figure 11B:
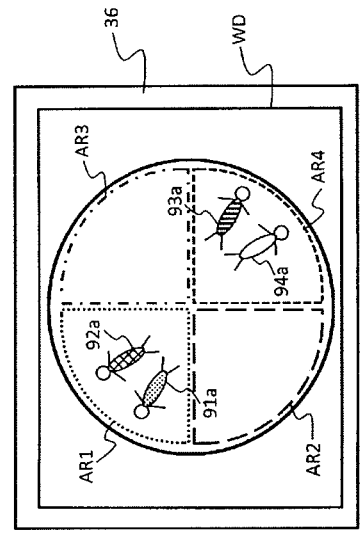
FIG. 11B is a diagram illustrating an example of an output image of a camera device displayed on a screen of a display device.
Figure 12:
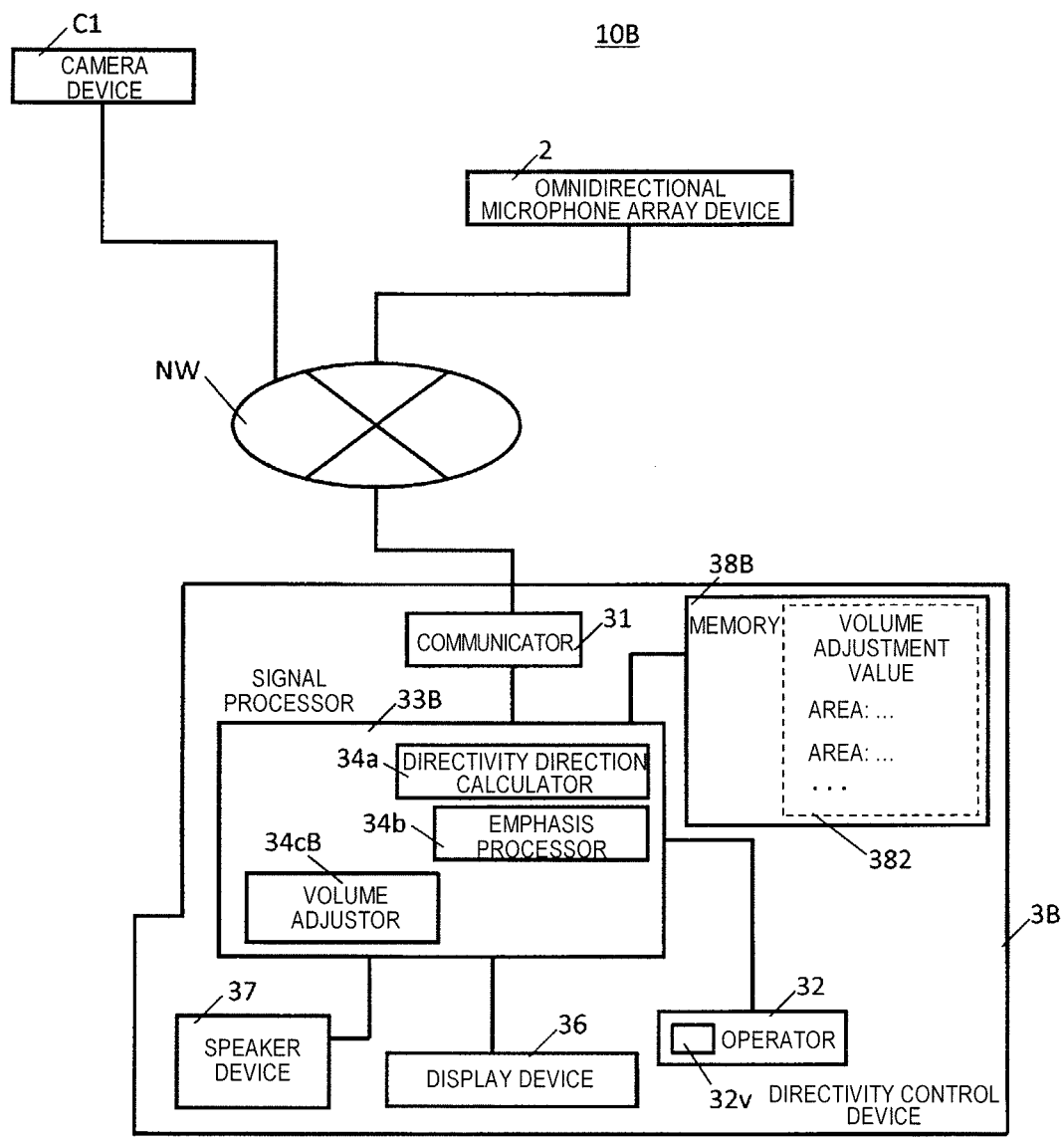
FIG. 12 is a block diagram illustrating an example of a system configuration of an audio processing system of the second modification example of the second exemplary embodiment.

In a second modification example of the second exemplary embodiment, signal processor 33B stores a value input from operator 32 according to an input operation of a user with respect to a predetermined volume adjustment value setting screen (not shown) in memory 38B as a volume adjustment value for each area of an output image of camera device C1 for audio collection area K displayed on display device 36 (see FIGS. 11A, 11B, and 12).

FIG. 11A is a diagram illustrating an example of a state at the time of audio collection of audio collection area K in which audio processing system 10B of the second modification example of the second exemplary embodiment is installed. FIG. 11B is a diagram illustrating an example of an output image of camera device C1 displayed on a screen of display device 36. FIG. 12 is a block diagram illustrating an example of a system configuration of audio processing system 10B of the second modification example of the second exemplary embodiment. In audio processing system 10B illustrated in FIG. 12, directivity control device 3 is replaced with directivity control device 3B and other components are the same, as compared to audio processing system 10 illustrated in FIG. 1. Accordingly, description of the same content will be simplified or omitted and different content will be described.

In FIG. 11A, an example in which camera device C1 and omnidirectional microphone array device 2 are integrally attached to ceiling surface 85 is shown, and four persons 91a, 92a, 93a, and 94a are standing on floor BL in audio collection area K. Persons 91a and 92a have a conversation such as "Hello" and "Hi!", and person 93a greets person 94a with, for example, "Good morning!."

In FIG. 11B, an image (for example, omnidirectional image) captured by camera device C1 is displayed on display device 36. In this omnidirectional image, for example, four areas AR1, AR2, AR3, and AR4 are determined according to coordinates of the omnidirectional image in advance. Two persons 91a and 92a are displayed in area AR1, and two persons 93a and 94a are displayed in area AR4. In the second modification example of the second exemplary embodiment, the same or different volume adjustment values have been determined and set for the respective areas illustrated in FIG. 11B. The volume adjustment values for the respective areas are stored in memory 38B.

Volume adjustor 34cB illustrated in FIG. 12 reads volume adjustment value 382 corresponding to the area in which the coordinates of the designation position are included, from memory 38B, and adjusts the volume of the audio data in a directivity state subjected to the emphasis process by emphasis processor 34b using read volume adjustment value 382. A volume adjustment method using volume adjustment value 382 for each area is the same as in the first exemplary embodiment, and thus, detailed description thereof will be omitted.

Figure 13A:
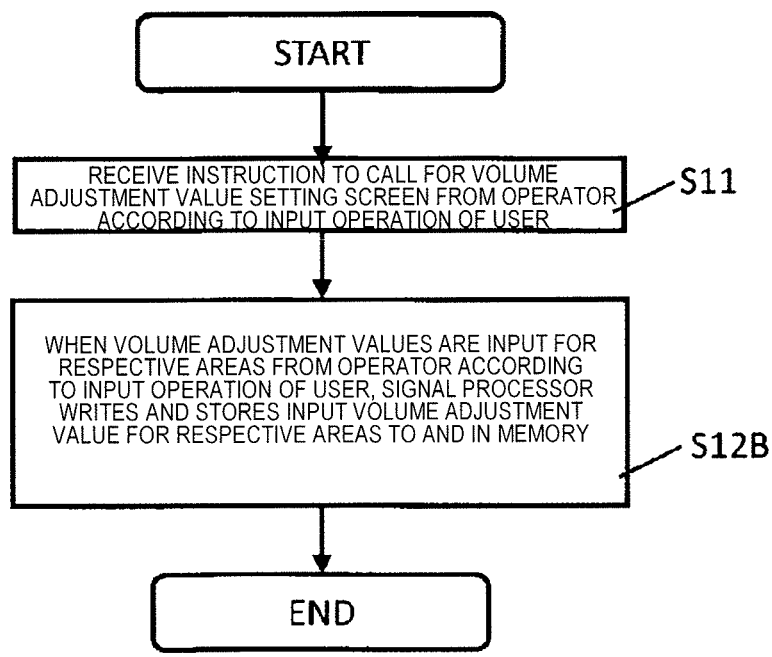
FIG. 13A is a flowchart illustrating an example of an operation procedure regarding pre-setting of a volume adjustment value for each area.
Figure 13B:
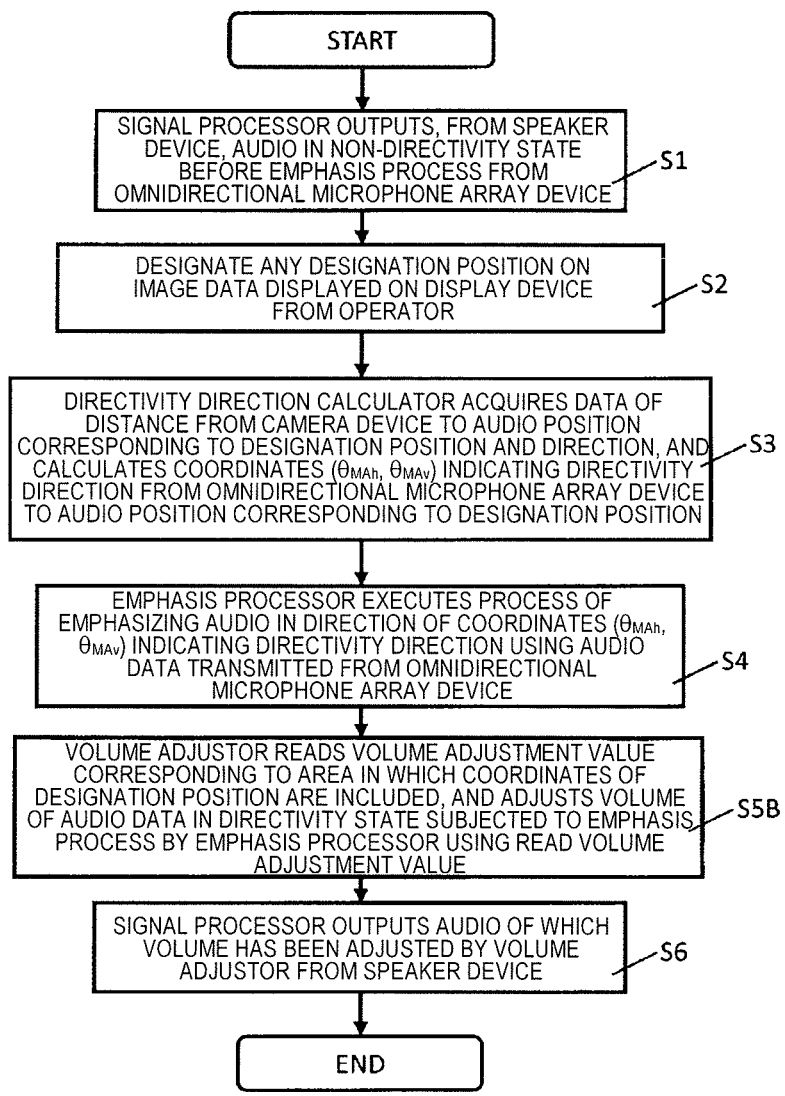
FIG. 13B is a flowchart illustrating an example of an operation procedure in an actual operation of an audio processing system of a second modification example of the second exemplary embodiment.

Next, an operation procedure of audio processing system 10B of the present exemplary embodiment will be described with reference to FIGS. 13A and 13B. FIG. 13A is a flowchart illustrating an example of an operation procedure regarding pre-setting of volume adjustment value 382 for each area. FIG. 13B is a flowchart illustrating an example of an operation procedure in an actual operation of audio processing system 10B of the second modification example of the second exemplary embodiment. In FIG. 13B, the same processes as the respective processes in FIG. 7 corresponding to audio processing system 10 of the first exemplary embodiment are denoted with the same step numerals, description thereof will be simplified or omitted, and different content will be described.

In FIG. 13A, when an instruction to call for the volume adjustment value setting screen is received from operator 32 according to an input operation of the user (S11), signal processor 33B displays the volume adjustment value setting screen on display device 36 according to the instruction from operator 32. When volume adjustment values 382 are input for the respective areas from operator 32 according to an input operation of the user, signal processor 33B writes and stores input volume adjustment value 382 for the respective areas to and in memory 38B (S12B). Thus, a process of pre-setting volume adjustment values 382 for the respective areas in memory 38B ends.

In FIG. 13B, after step S4, volume adjustor 34cB reads volume adjustment value 382 corresponding to the area in which the coordinates of the designation position designated in step S2 are included, from memory 38B, and adjusts the volume of the audio data in a directivity state subjected to the emphasis process by emphasis processor 34b using read volume adjusting value 382 (S5B). A process subsequent to step S5B is the same as step S6 of FIG. 7, and thus, description thereof will be omitted.

Thus, audio processing system 10B of the second modification example of the second exemplary embodiment reads volume adjustment value 382 input for each area in advance from memory 38B according to the area on the image in audio collection area K in which the coordinates of the designation position on the output image of camera device C1 displayed on display device 36 are included, and adjusts the volume of the audio data in a directivity state after the emphasis process. Accordingly, it is possible to select volume adjustment value 382 according to the position of the person (for example, speaker) in audio collection area K, and appropriately adjust the volume of the audio data in a directivity state after the emphasis process. Further, since volume adjustment value 382 for each area is written to memory 38B, it is possible to change volume adjustment value 382 appropriately (for example, during an actual operation) according to a change in an installation environment of audio processing system 10B.

Third Modification Example of Second Exemplary Embodiment

Figure 14:
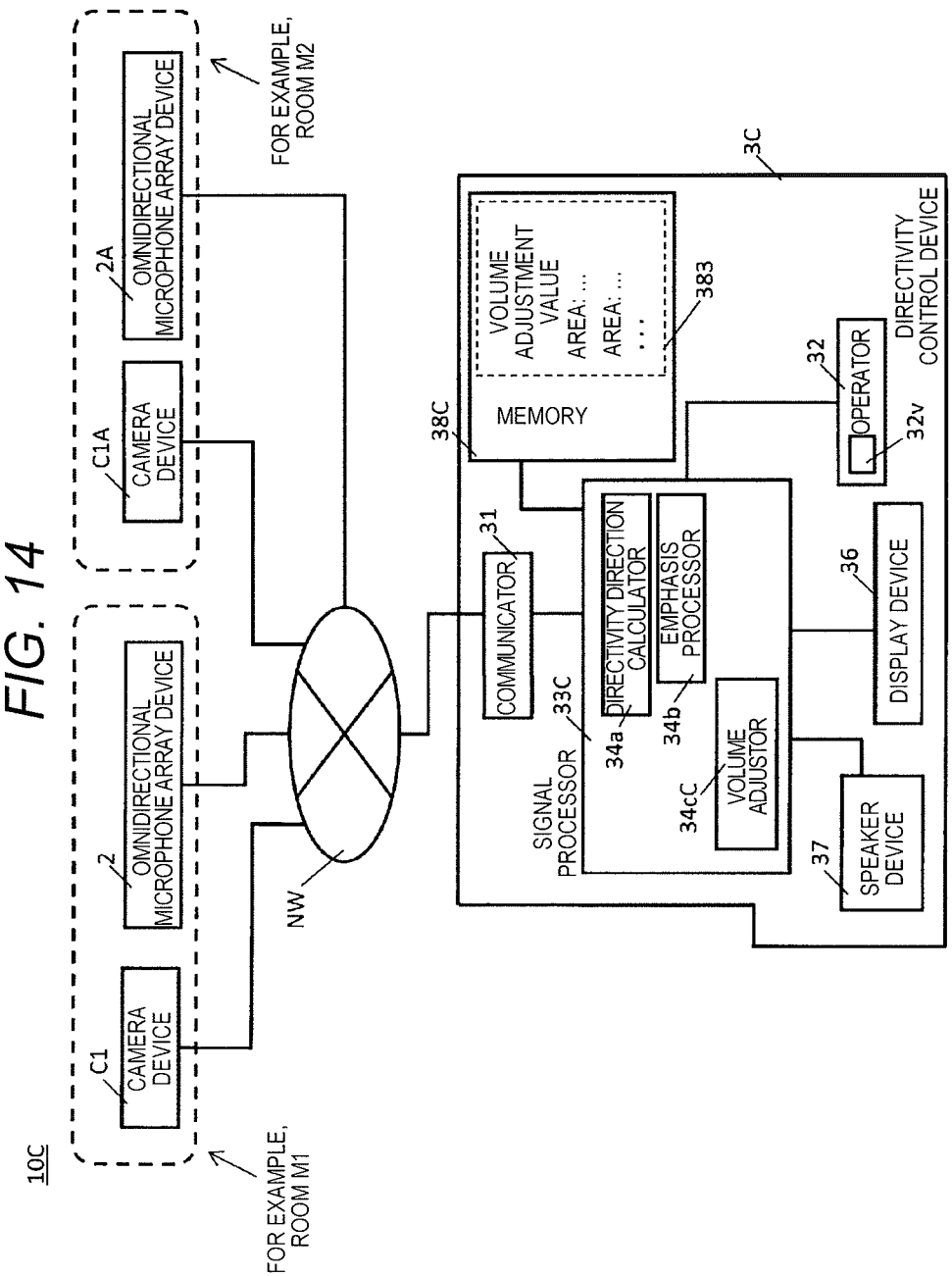
FIG. 14 is a block diagram illustrating an example of a system configuration of an audio processing system of a third modification example of the second exemplary embodiment.

In a third modification example of the second exemplary embodiment, audio processing system 10C includes a plurality of camera devices and a plurality of omnidirectional microphone array devices, and one of the camera devices and one of the omnidirectional microphone array devices are associated with each other. That is, the omnidirectional microphone array device that collects audio at a place at which one camera device performs imaging is determined in advance (see FIG. 14). FIG. 14 is a block diagram illustrating an example of a system configuration of audio processing system 10C of the third modification example of the second exemplary embodiment.

As illustrated in FIG. 14, for example, a camera device that images room M1 in an audio collection area is camera device C1, and an omnidirectional microphone array device that collects audio of room M1 is omnidirectional microphone array device 2. Similarly, a camera device that images room M2 in an audio collection area is camera device C1A, and an omnidirectional microphone array device that collects audio of room M2 is omnidirectional microphone array device 2A. In audio processing system 10C illustrated in FIG. 14, directivity control device 3 is replaced with directivity control device 3C, and other components are the same, as compared to audio processing system 10 illustrated in FIG. 1. Accordingly, description of the same content will be simplified or omitted and different content will be described.

Volume adjustor 34cC reads volume adjustment value 383 written in each omnidirectional microphone array device from memory 38C according to the omnidirectional microphone array device selected by operator 32 according to an input operation of a user, and adjusts the volume of the audio data in a directivity state subjected to the emphasis process by emphasis processor 34b using read volume adjustment value 383. A volume adjustment method using volume adjustment value 383 of each omnidirectional microphone array device is the same as in the first exemplary embodiment, and thus, detailed description thereof will be omitted.

Figure 15A:
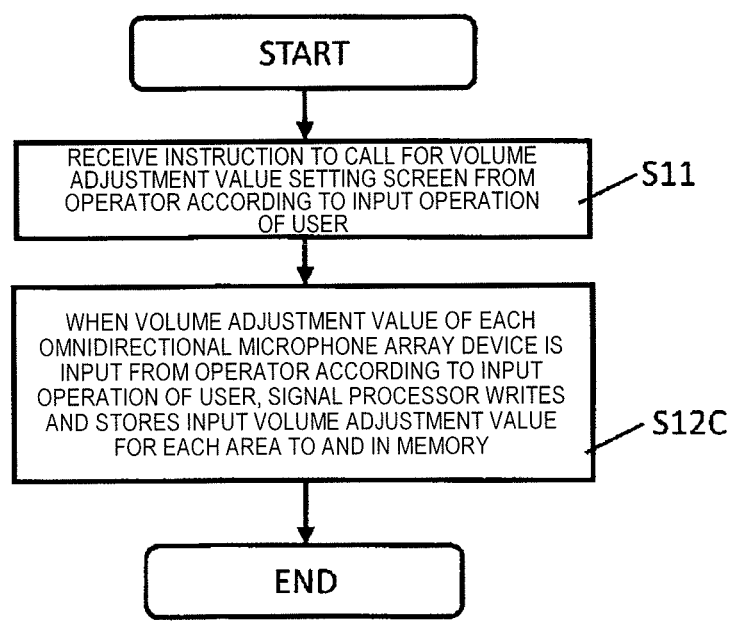
FIG. 15A is a flowchart illustrating an example of an operation procedure regarding pre-setting of a volume adjustment value of each omnidirectional microphone array device.
Figure 15B:
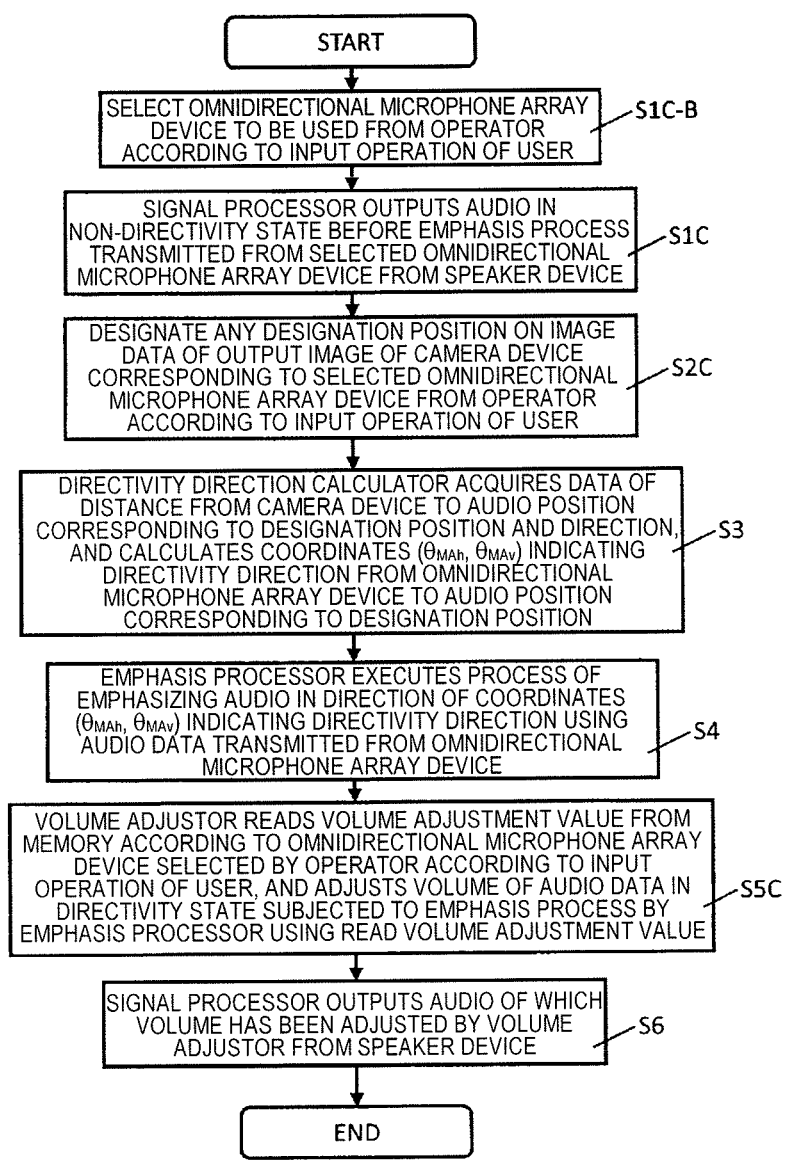
FIG. 15B is a flowchart illustrating an example of an operation procedure in an actual operation of an audio processing system of a third modification example of the second exemplary embodiment.

Next, an operation procedure of audio processing system 10C according to the present exemplary embodiment will be described with reference to FIGS. 15A and 15B. FIG. 15A is a flowchart illustrating an example of an operation procedure regarding pre-setting of volume adjustment value 383 of each omnidirectional microphone array device. FIG. 15B is a flowchart illustrating an example of an operation procedure in an actual operation of audio processing system 10C of the third modification example of the second exemplary embodiment. In FIG. 15B, the same processes as the respective processes in FIG. 7 corresponding to audio processing system 10 of the first exemplary embodiment are denoted with the same step numerals, description thereof will be simplified or omitted, and different content will be described.

In FIG. 15A, when an instruction to call for a volume adjustment value setting screen (not shown) is received from operator 32 according to an input operation of the user (S11), signal processor 33C displays the volume adjustment value setting screen on display device 36 according to the instruction from operator 32. When volume adjustment value 383 of each omnidirectional microphone array device is input from operator 32 according to an input operation of the user, signal processor 33C writes and stores input volume adjustment value 383 for each area to and in memory 38C (S12C). Thus, a process of pre-setting volume adjustment value 383 of each omnidirectional microphone array device in memory 38C ends.

In FIG. 15B, first, when an omnidirectional microphone array device (for example, omnidirectional microphone array device 2) to be used is selected from operator 32 according to an input operation of the user (S1C-B), signal processor 33C outputs audio (non-directional audio) in a non-directivity state before an emphasis process included in an audio packet transmitted from omnidirectional microphone array device 2 selected in step S1C-B from speaker device 37 (S1C), and displays image data included in an image packet transmitted from camera device C1 corresponding to selected omnidirectional microphone array device 2 on display device 36.

It is assumed that after step S1C, any designation position on the image data of the output image of camera device C1 corresponding to omnidirectional microphone array device 2 selected in step S1C-B is designated, for example, from operator 32 according to an input operation by the user as one or more designation directions for audio emphasis for switching from a non-directivity state to a directivity state (S2C).

Further, after step S4, volume adjustor 34cC reads volume adjustment value 383 written to each omnidirectional microphone array device from memory 38C according to omnidirectional microphone array device 2 selected by operator 32 according to an input operation of a user, and adjusts the volume of the audio data in a directivity state subjected to the emphasis process by emphasis processor 34b using read volume adjustment value 383 (S5C). A process subsequent to step S5C is the same as step S6 of FIG. 7, and thus, description thereof will be omitted.

Thus, in audio processing system 10C of the third modification example of the second exemplary embodiment, a plurality of combinations of omnidirectional microphone array devices and camera devices that image audio collection area K are provided to be associated in one-to-one correspondence, the volume adjustment value corresponding to the selected omnidirectional microphone array device is read from memory 38C according to the selection of any one of the omnidirectional microphone array devices, and the volume of the audio data in the directivity state after the emphasis process is adjusted. Accordingly, for example, even when a plurality of bases are monitored in a central monitoring room or the like, it is possible to select volume adjustment value 383 according to an installation environment of the omnidirectional microphone array device of each base, and appropriately adjust the volume of the audio data in the directivity state.

Third Exemplary Embodiment

In each exemplary embodiment or its modification example described above, the value input from operator 32 according to the input operation of the user in advance is used as the volume adjustment value. In a third exemplary embodiment, when predetermined audio data (for example, audio data of a person) is detected in a designation direction from omnidirectional microphone array device 2 to audio position A corresponding to the designation position input by operator 32, volume adjustment value calculator 34d of signal processor 33D calculates the volume adjustment value based on a difference between acoustic levels of the audio data before and after the emphasis process (see FIG. 16A).

Figure 16A:
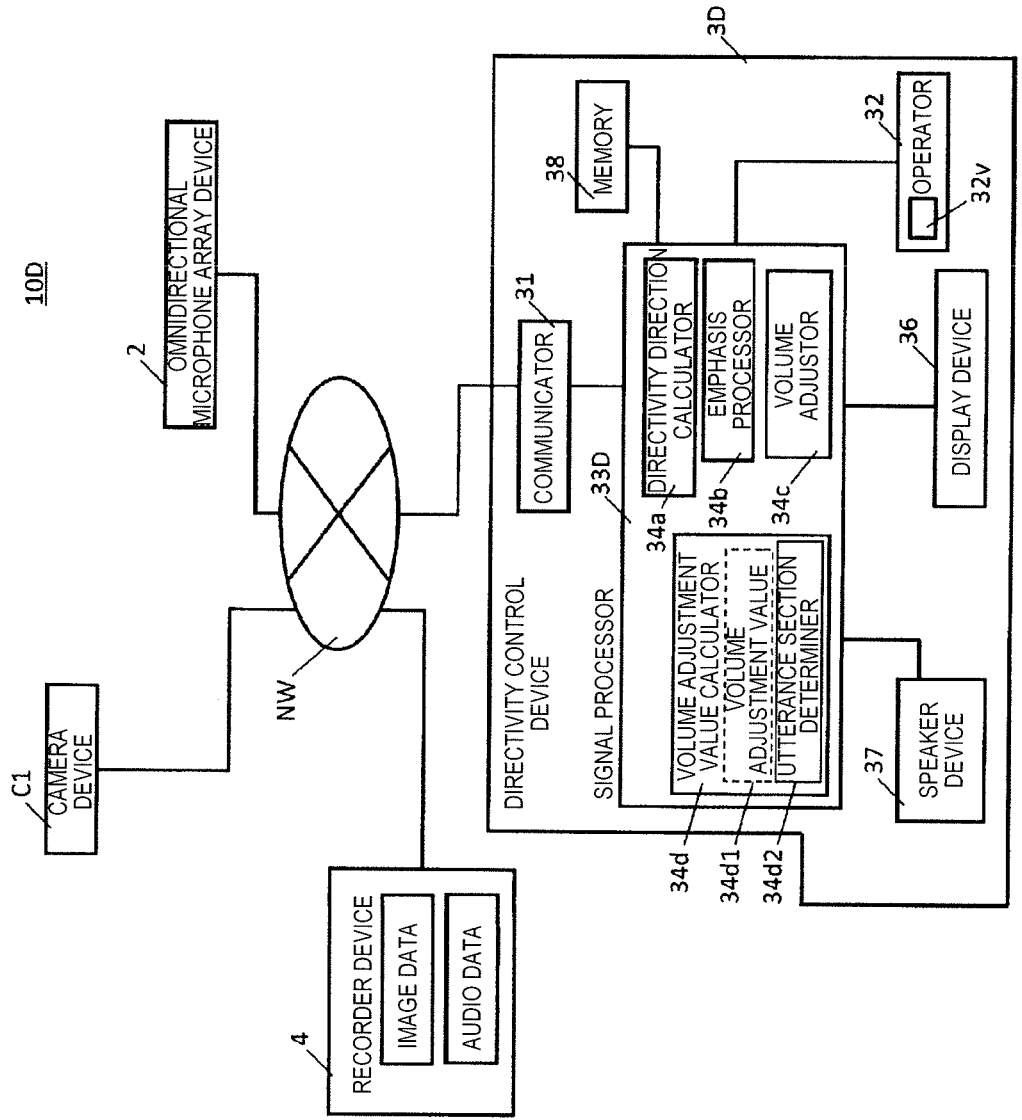
FIG. 16A is a block diagram illustrating an example of a system configuration of an audio processing system of a third exemplary embodiment.

FIG. 16A is a block diagram illustrating an example of a system configuration of audio processing system 10D of the third exemplary embodiment. In audio processing system 10D illustrated in FIG. 16A, recorder device 4 is newly added, directivity control device 3 is replaced with directivity control device 3D, and other components are the same, as compared to audio processing system 10 illustrated in FIG. 1, and thus, the description of the same content will be simplified or omitted, and different content will be described.

Recorder device 4 is connected to network NW, and stores audio data included in an audio packet transmitted from omnidirectional microphone array device 2 and image data included in an image packet transmitted from camera device C1 in association with each other.

Signal processor 33D includes directivity direction calculator 34a, emphasis processor 34b, volume adjustor 34c, and volume adjustment value calculator 34d. Volume adjustment value calculator 34d holds volume adjustment value 34d1 that is a calculation result of volume adjustment value calculator 34d, and includes utterance section determiner 34d2. Utterance section determiner 34d2 may be provided separately from volume adjustment value calculator 34d as long as utterance section determiner 34d2 is included in signal processor 33D.

Volume adjustment value calculator 34d calculates the volume adjustment value from omnidirectional microphone array device 2. The calculation of the volume adjustment value is performed based on a difference between acoustic levels of the audio data before and after the emphasis process when it is determined by utterance section determiner 34d2 that predetermined audio data (for example, audio data of a person) in a designation direction to audio position A corresponding to the designation position input by operator 32 is detected. An example of calculation of the volume adjustment value will be described below with reference to FIGS. 17A and 17B.

Utterance section determiner 34d2 determines whether the predetermined audio data (for example, audio data of a person) in a designation direction to audio position A corresponding to the designation position input by operator 32 is detected, based on the audio data in a directivity state after the emphasis process generated by emphasis processor 34b. For example, utterance section determiner 34d2 performs the determination according to whether an audio signal exceeding a predetermined acoustic level appears in a frequency bandwidth of 300 Hz to 3400 Hz that is an example of a human's audible band (see FIG. 25A).

Figure 16B:
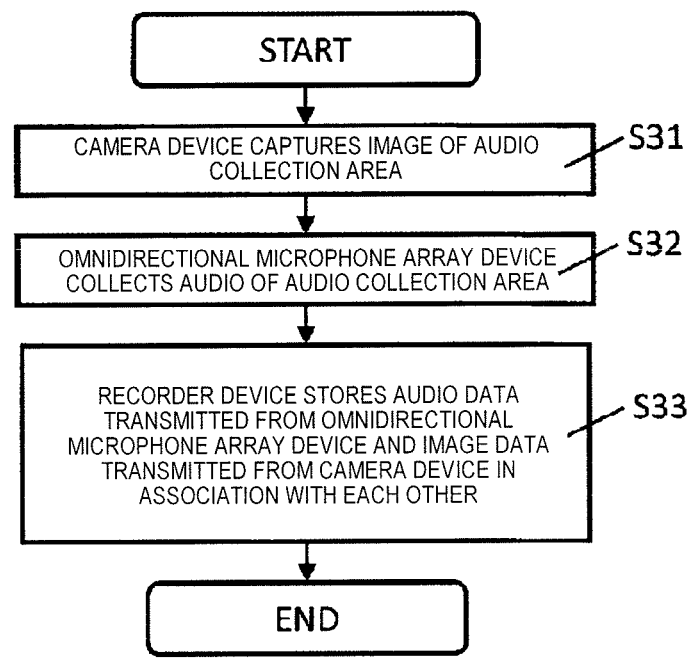
FIG. 16B is a flowchart illustrating an example of an operation procedure in which image data and audio data are recorded in a recorder device.
Figure 17B:
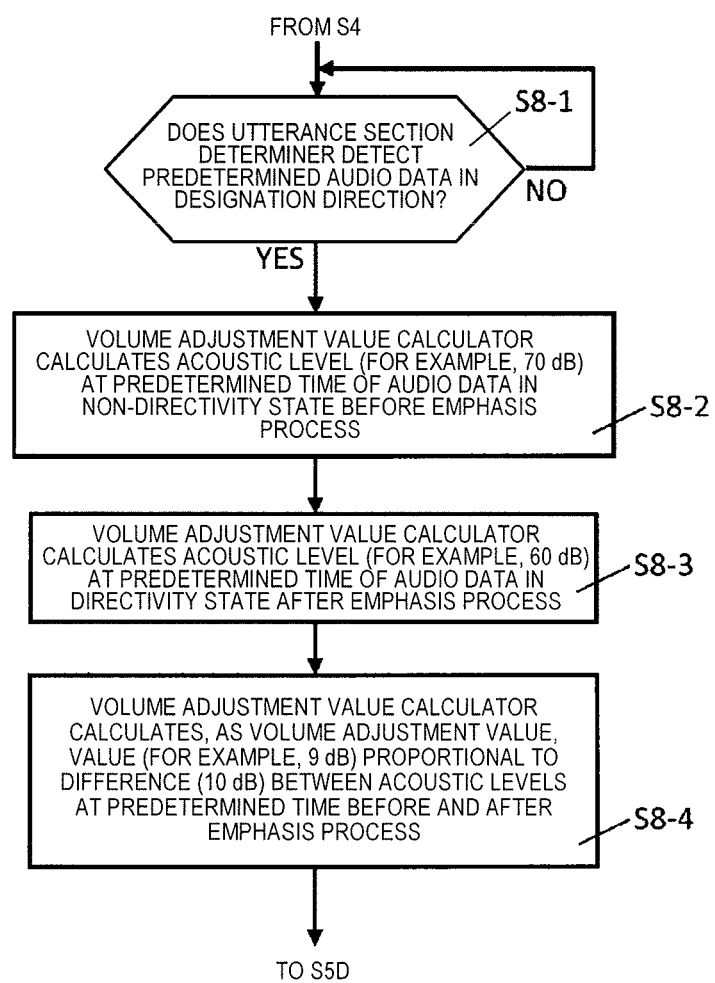
FIG. 17B is a flowchart illustrating respective examples of an operation procedure in an actual operation of the audio processing system of the third exemplary embodiment, and an operation procedure regarding calculation of a volume adjustment value.

Next, an operation procedure of audio processing system 10D of the present exemplary embodiment will be described with reference to FIG. 16B and FIGS. 17A and 17B. FIG. 16B is a flowchart illustrating an example of an operation procedure in which image data and audio data are recorded in the recorder device. FIGS. 17A and 17B are flowcharts illustrating respective examples of an operation procedure in an actual operation of audio processing system 10D of the third exemplary embodiment, and an operation procedure regarding calculation of the volume adjustment value. In FIGS. 17A and 17B, the same processes as the respective processes in FIG. 7 corresponding to audio processing system 10 of the first exemplary embodiment are denoted with the same step numerals, description thereof will be simplified or omitted, and different content will be described.

In FIG. 16B, when an actual operation of audio processing system 10D starts, camera device C1 captures an image of the audio collection area (S31), and omnidirectional microphone array device 2 collects audio of the audio collection area (S32). Image data obtained by capturing in step S31 is transmitted from camera device C1 to recorder device 4, and audio data obtained by audio collection in step S32 is transmitted from omnidirectional microphone array device 2 to recorder device 4. Steps S31 and S32 may be performed simultaneously or may be performed in any order.

Recorder device 4 stores the audio data included in an audio packet transmitted from omnidirectional microphone array device 2 and the image data included in an image packet transmitted from camera device C1 in association with each other (S33).

In FIG. 17A, signal processor 33D acquires the image data and the audio data from recorder device 4 to display the image data on display device 36, and outputs the audio data (accurately, audio data in a non-directivity state) from speaker device 37 (S7).

After step S4, the volume adjustment value is calculated by volume adjustment value calculator 34d (S8). More specifically, in FIG. 17B, utterance section determiner 34d2 determines whether the predetermined audio data (for example, audio data of a person) in the designation direction to audio position A corresponding to the designation position input by operator 32 is detected, based on the audio data in a directivity state after the emphasis process generated by emphasis processor 34b (S8-1).

When it is determined by utterance section determiner 34d2 that the predetermined audio data (for example, audio data of a person) in the designation direction from omnidirectional microphone array device 2 to audio position A corresponding to the designation position input by operator 32 is detected (YES in S8-1), volume adjustment value calculator 34d calculates the acoustic level (for example, 70 dB) at a predetermined time of the audio data in the non-directivity state before the emphasis process (S8-2).

Further, volume adjustment value calculator 34d calculates the acoustic level (for example, 60 dB) at a predetermined time of the audio data in a directivity state after an emphasis process (S8-3). That is, the acoustic level drops 10 dB due to the emphasis process of emphasis processor 34b. Therefore, volume adjustment value calculator 34d calculates, as volume adjustment value 34d1, a value (for example, 9 dB (=10 dB×90%) corresponding to 90%) which is proportional to a difference (10 dB) between acoustic levels at a predetermined time before and after the emphasis process (S8-4). Thus, a process of calculating the volume adjustment value in volume adjustment value calculator 34d ends.

After step S8, volume adjustor 34c adjusts the volume of the audio data in a directivity state subjected to the emphasis process by emphasis processor 34b using volume adjustment value 34d1 calculated in step S8 (S5D). Since a process subsequent to step S5D is the same as step S6 illustrated in FIG. 7, description thereof will be omitted.

Thus, audio processing system 10D of the present exemplary embodiment determines whether the predetermined audio data in the designation direction (for example, audio data of a person) is detected based on the audio data in a directivity state after an emphasis process, calculates volume adjustment value 34d1 based on the difference between acoustic levels of the audio data before and after the emphasis process when determining that the audio data is detected, and adjusts the volume of the audio data in a directivity state after the emphasis process using calculated volume adjustment value 34d1.

Accordingly, since audio processing system 10D can calculate, as volume adjustment value 34d1, the value proportional to the difference (in other words, an amount of suppression of volume of utterance audio of the person) between acoustic levels before and after the emphasis process of the predetermined audio data detected in the designation direction, it is possible to adjust the volume of the audio data in a directivity state using appropriate volume adjustment value 34d1 according to a change in an installation environment of audio processing system 10D without causing the user to set volume adjustment value 34d1 in advance. For example, since volume adjustor 34c can obtain volume of 69 dB by adding 9 dB that is a volume adjustment value calculated by volume adjustment value calculator 34d to the acoustic level at a predetermined time of the audio data in a directivity state after the emphasis process, a difference with 70 dB that is the acoustic level at a predetermined time of the audio data in the non-directivity state is decreased without limit, and the volume of the audio data in a directivity state can be automatically adjusted.

First Modification Example of Third Exemplary Embodiment

Figure 18A:
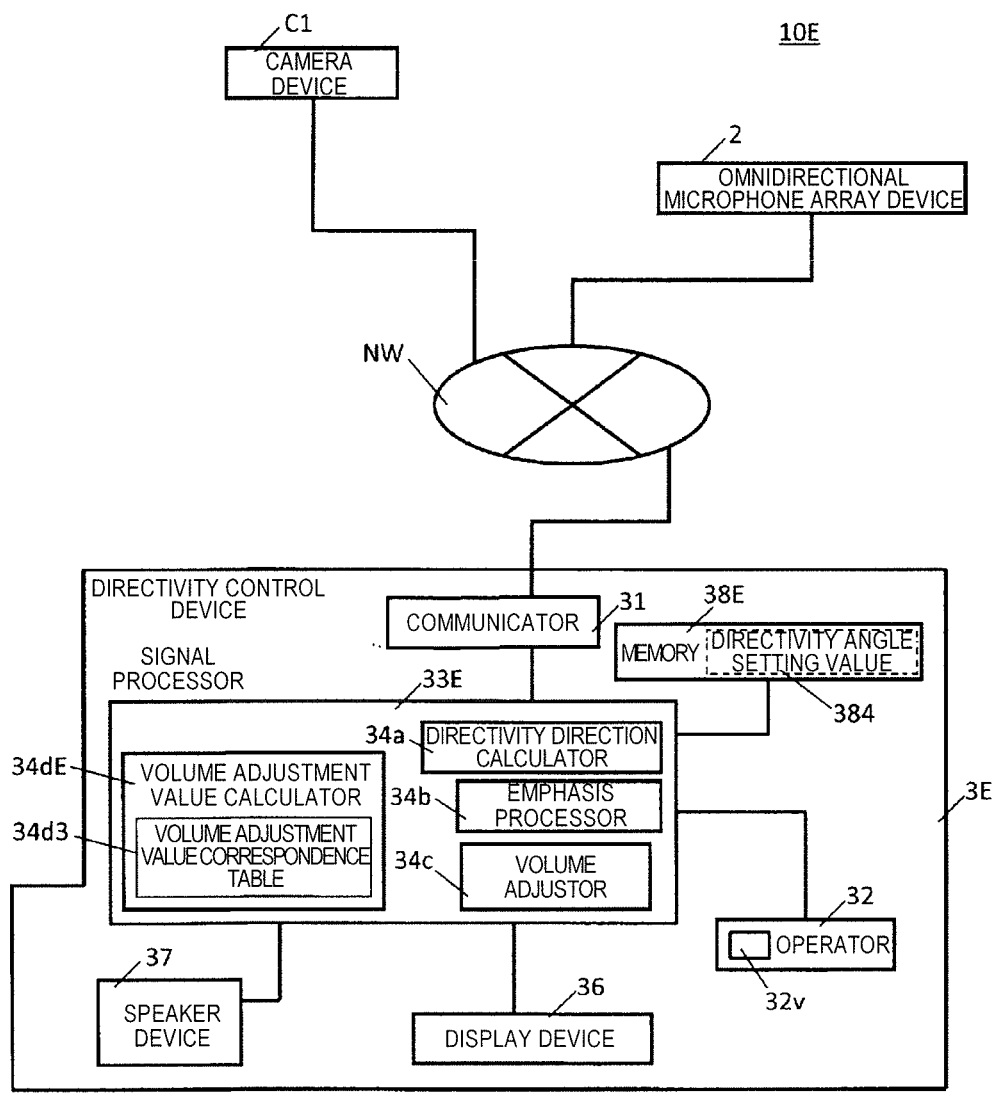
FIG. 18A is a block diagram illustrating an example of a system configuration of an audio processing system of a first modification example of the third exemplary embodiment.

In a first modification example of the third exemplary embodiment, volume adjustment value calculator 34dE in signal processor 33E calculates a volume adjustment value according to a setting value of a directivity angle (directivity angle setting value 384) indicating a beam width of a main lobe of directivity in the emphasis process (see FIG. 18A). FIG. 18A is a block diagram illustrating an example of a system configuration of audio processing system 10E of the first modification example of the third exemplary embodiment. In audio processing system 10E illustrated in FIG. 18A, directivity control device 3 is replaced with directivity control device 3E, and other components are the same, as compared to audio processing system 10 illustrated in FIG. 1. Accordingly, description of the same content will be simplified or omitted and different content will be described.

Volume adjustment value calculator 34dE holds volume adjustment value correspondence table 34d3, and calculates the volume adjustment value corresponding to directivity angle setting value 384 set in memory 38E using volume adjustment value correspondence table 34d3. For example, a correspondence relationship (for example, a relational expression) between directivity angle setting value 384 and the volume adjustment value is stored in volume adjustment value correspondence table 34d3.

Here, a size relationship between directivity angle setting value 384 and the volume adjustment value will be described.

When directivity angle setting value 384 is small, the beam width of the main lobe of the directivity is narrow and a suppression range of volume is widened due to the emphasis process in emphasis processor 34b. Further, since the number of microphones is increased in order to widen the suppression range of volume, the number of microphones used in the averaging process is increased, and the volume tends to be decreased due to the emphasis process.

On the other hand, when directivity angle setting value 384 is great, the beam width of the main lobe of the directivity is wide and the suppression range of volume is narrow due to the emphasis process in emphasis processor 34b. Further, since the number of microphones may be decreased in order to narrow the suppression range of volume, the number of microphones used in the averaging process is decreased, and the volume tends not to be correspondingly decreased due to the emphasis process.

Figure 18B:
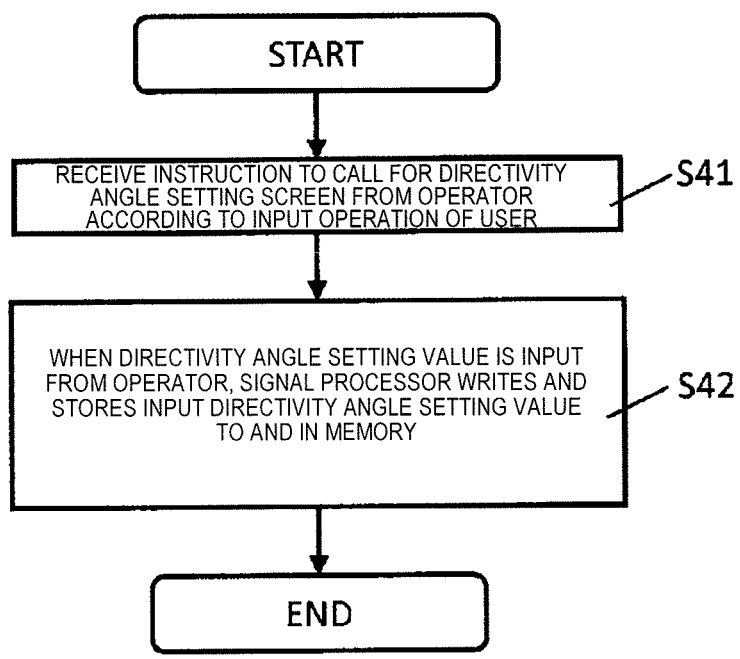
FIG. 18B is a flowchart illustrating an example of an operation procedure regarding pre-setting of a directivity angle setting value.
Figure 19B:
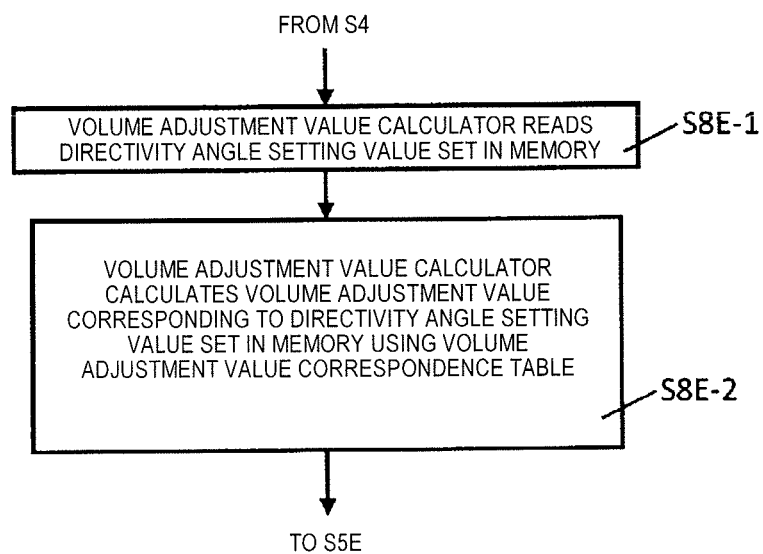
FIG. 19B is a flowchart illustrating respective examples of an operation procedure in an actual operation of the audio processing system of the first modification example of the third exemplary embodiment, and an operation procedure regarding calculation of a volume adjustment value.

Next, an operation procedure of audio processing system 10E of the present exemplary embodiment will be described with reference to FIG. 18B and FIGS. 19A and 19B. FIG. 18B is a flowchart illustrating an example of an operation procedure regarding pre-setting of directivity angle setting value 384. FIGS. 19A and 19B are flowcharts illustrating respective examples of an operation procedure in an actual operation of audio processing system 10E of the first modification example of the third exemplary embodiment, and an operation procedure regarding calculation of the volume adjustment value. In FIGS. 19A and 19B, the same processes as the respective processes in FIG. 7 corresponding to audio processing system 10 of the first exemplary embodiment are denoted with the same step numerals, description thereof will be simplified or omitted, and different content will be described.

In FIG. 18B, when an instruction to call for a directivity angle setting screen (not shown) is received from operator 32 according to an input operation of the user (S41), signal processor 33E displays the directivity angle setting screen on display device 36 according to the instruction from operator 32. When directivity angle setting value 384 is input from operator 32 according to an input operation of the user, signal processor 33E writes and stores input directivity angle setting value 384 to and in memory 38E (S42). Thus, a process of pre-setting directivity angle setting value 384 in memory 38E ends.

In FIG. 19A, after step S4, the volume adjustment value is calculated by volume adjustment value calculator 34dE (S8E). More specifically, in FIG. 19B, volume adjustment value calculator 34dE reads directivity angle setting value 384 set in memory 38E (S8E-1), and calculates the volume adjustment value corresponding to directivity angle setting value 384 set in memory 38E using volume adjustment value correspondence table 34d3 (S8E-2).

After step S8E, volume adjustor 34c adjusts the volume of the audio data in a directivity state subjected to the emphasis process by emphasis processor 34b using the volume adjustment value calculated in step S8E (S5E). Since a process subsequent to step S5E is the same as step S6 illustrated in FIG. 7, description thereof will be omitted.

Thus, since audio processing system 10E of the first modification example of the third exemplary embodiment reads directivity angle setting value 384 indicating the beam width of the directivity input with respect to a predetermined directivity angle setting screen (not shown) from memory 38E, and adjusts the volume of the audio data in a directivity state after the emphasis process, it is possible to appropriately adjust the volume of the audio data in a directivity state after the emphasis process according to directivity performance required by the user. Further, since directivity angle setting value 384 is written to memory 38E, it is possible to appropriately change directivity angle setting value 384 according to a change in an installation environment of audio processing system 10E.

When a directivity angle setting value is input from operator 32 according to the input operation of the user during pre-setting of directivity angle setting value 384 or the actual operation of audio processing system 10E, volume adjustment value calculator 34dE may calculate the volume adjustment value corresponding to the input directivity angle setting value in real time using volume adjustment value correspondence table 34d3. Further, volume adjustment value calculator 34dE may read the volume adjustment value used in previous volume adjustment from memory 38E and use the read volume adjustment value as the volume adjustment value instead of calculating the volume adjustment value each time.

Signal processor 33E may use a setting value of microphone sensitivity of the microphone included in camera device C1 in advance as microphone sensitivity of each microphone of omnidirectional microphone array device 2, and uniquely determine the directivity angle setting value according to the microphone sensitivity.

Further, volume adjustment value calculator 34dE may calculate the volume adjustment value according to an imaging mode of camera device C1, an imaging point in the audio collection area, and a degree of zoom of camera device C1.

Further, signal processor 33E may uniquely determine the directivity angle setting value, for example, according to a microphone sensitivity set in a microphone installed in advance (a microphone different from omnidirectional microphone array device 2) in audio collection area K.

Second Modification Example of Third Exemplary Embodiment

In a second modification example of the third exemplary embodiment, when a plurality (for example, 2. the same applies hereinafter) of designation positions on the images displayed on display device 36 are designated from operator 32 according to the input operation of the user, signal processor 33E performs control so that acoustic levels of the audio data after the audios in respective designation directions are subjected to the emphasis process are substantially the same before and after the emphasis process according to the number of directivities (that is, the number of designation positions on the image displayed on display device 36), and an acoustic level of the non-directional audio and an acoustic level after the combination process of the audio data after audios in the respective designation directions are subjected to the emphasis process are in a certain range (see FIGS. 20A and 20B).

Figure 20A:
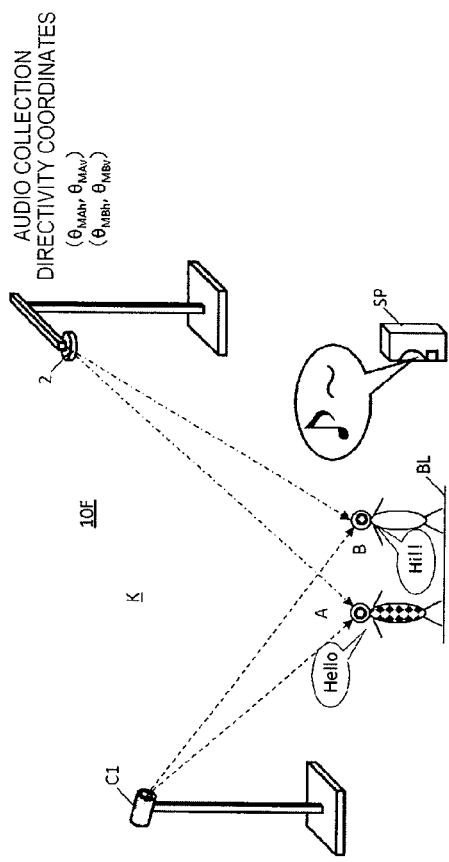
FIG. 20A is a schematic diagram illustrating an overview of an operation of an audio processing system of a second modification example of the third exemplary embodiment.
Figure 20B:
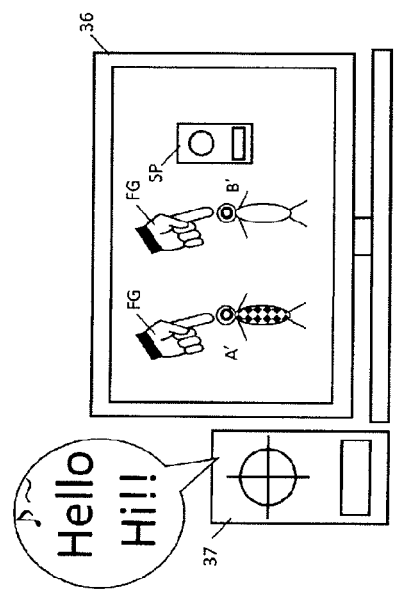
FIG. 20B is a schematic diagram illustrating an overview of an operation of an audio processing system of the second modification example of the third exemplary embodiment.

FIGS. 20A and 20B are schematic diagrams illustrating an overview of an operation of audio processing system 10F of the second modification example of the third exemplary embodiment. In the description of FIG. 20A, content different from the description of FIG. 1A will be described, and description of the same content will be omitted. In FIG. 20A, two persons as targets have a conversation and "Hello" and "Hi!!" are examples of the conversation.

In FIG. 20B, when two designation positions A' and B' on the image displayed on display device 36 are designated by finger FG of the user, directivity control device 3D calculates coordinates ($\theta_{MAh}$, $\theta_{MAv}$) indicating the directivity direction from the installation position of omnidirectional microphone array device 2 to audio position A using coordinate data of designation position A', and performs an emphasis process in the directivity direction indicated by the coordinates ($\theta_{MAh}$, $\theta_{MAv}$).

Further, directivity control device 3D calculates coordinates ($\theta_{MBh}$, $\theta_{MBv}$) indicating the directivity direction from the installation position of omnidirectional microphone array device 2 to audio position B using coordinate data of designation position B', and performs an emphasis process in the directivity direction indicated by the coordinates ($\theta_{MBh}$, $\theta_{MBv}$). Accordingly, conversation content ("Hello" and "Hi!!") of the two persons from speaker device 37 has relatively higher volume than output sound ("♪~") of speaker device SP, as illustrated in FIG. 20B.

Further, since the system configuration of audio processing system 10F of the second modification example of the third exemplary embodiment is the same as the system configuration of audio processing system 10D of the third exemplary embodiment, the same reference numerals as reference numerals of the respective units of audio processing system 10D are used for reference numerals used in the description of respective units of audio processing system 10F, detailed description of the respective units will be omitted, and different content will be described.

Figure 21A:
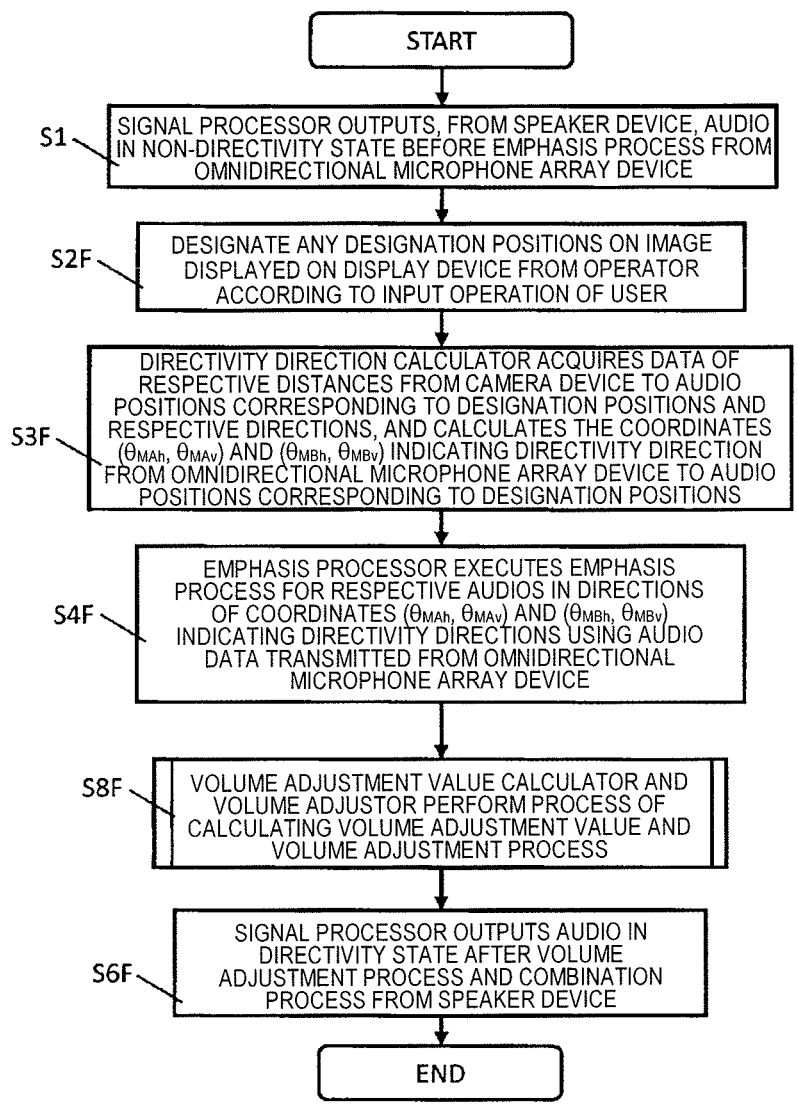
FIG. 21A is a flowchart illustrating respective examples of an operation procedure in an actual operation of an audio processing system of the second modification example of the third exemplary embodiment, and an operation procedure regarding calculation of a volume adjustment value.

Next, an operation procedure of audio processing system 10F of the present exemplary embodiment will be described with reference to FIGS. 21A and 21B. FIGS. 21A and 21B are flowcharts illustrating respective examples of an operation procedure in an actual operation of audio processing system 10F of the second modification example of the third exemplary embodiment, and an operation procedure regarding calculation of the volume adjustment value. In FIGS. 21A and 21B, the same processes as the respective processes in FIG. 7 corresponding to audio processing system 10 of the first exemplary embodiment are denoted with the same step numerals, description thereof will be simplified or omitted, and different content will be described.

In FIG. 21A, it is assumed that after step S1, any designation positions A' and B' on the image displayed on display device 36 are designated, for example, from operator 32 according to the input operation of the user as one or more designation directions for audio emphasis for switching from a non-directivity state to a directivity state (S2F).

In this case, directivity direction calculator 34a acquires data of respective distances and respective directions (horizontal angle and vertical angle) from camera device C1 to audio positions A and B corresponding to designation positions A' and B', and calculates the coordinates ($\theta_{MAh}$, $\theta_{MAv}$) and ($\theta_{MBh}$, $\theta_{MBv}$) indicating a directivity direction (designation direction) from omnidirectional microphone array device 2 to audio positions A and B corresponding to designation positions A' and B' using the data (S3F).

After step S3F, emphasis processor 34b executes an emphasis process for the respective audios in directions of the coordinates ($\theta_{MAh}$, $\theta_{MAv}$) and ($\theta_{MBh}$, $\theta_{MBv}$) indicating the directivity directions using the audio data included in the audio packet transmitted from omnidirectional microphone array device 2, and generates respective audio data in a directivity state after the emphasis process (S4F). After step S4F, a process of calculating the volume adjustment value and a volume adjustment process are performed by volume adjustment value calculator 34d and volume adjustor 34c, respectively (S8F). After step S4F, signal processor 33E outputs the audio in the directivity state after the volume adjustment process and the combination process from speaker device 37 (S6F).

More specifically, in FIG. 21B, utterance section determiner 34d2 determines whether the predetermined audio data (for example, audio data of a person) in the designation direction to audio positions A and B corresponding to designation positions A' and B' input by operator 32 is detected, based on the audio data in a directivity state after each emphasis process generated by emphasis processor 34b in step S4F (S8F-1).

When it is determined by utterance section determiner 34d2 that the predetermined audio data (for example, audio data of a person) in the designation direction from omnidirectional microphone array device 2 to audio positions A and B corresponding to designation positions A' and B' input by operator 32 is detected (YES in S8F-1), volume adjustment value calculator 34d calculates an acoustic level (for example, 65 dB) at a predetermined time of the audio data in the non-directivity state before the emphasis process (S8F-2).

Further, volume adjustment value calculator 34d calculates the acoustic levels (for example, audio position A: 55 dB and audio position B: 50 dB) at a predetermined time of the audio data in a directivity state subjected to the emphasis process in the designation direction from omnidirectional microphone array device 2 to audio positions A and B (S8F-3).

Volume adjustment value calculator 34d compares the respective acoustic levels calculated in step S8F-3. For example, when reference volume is volume in audio position B in which the acoustic level is low, volume adjustment value calculator 34d calculates a value (for example, 4.5 dB (=5 dB×90%) corresponding to 90%) proportional to a difference (for example, 5 dB) between the respective acoustic levels as volume adjustment value 34d1 for adjusting the volume of the audio in audio position B in which the acoustic level is low (S8F-4).

Further, for example, when the reference volume is volume in audio position A in which the acoustic level is high, volume adjustment value calculator 34d calculates 0 dB as volume adjustment value 34d1 for adjusting the volume of the audio in audio position A in which the acoustic level is high (S8F-4).

Thus, when there are a plurality of designation positions designated in step S2F, volume adjustment value calculator 34d calculates, for each audio position, volume adjustment value 34d1 for adjusting the volume into volume close to the reference volume (for example, volume in audio position A in which the acoustic level is high among audio positions A and B when there are two designation positions A' and B').

Further, volume adjustor 34c performs adjustment to add the volume of the audio in a directivity state after the emphasis process in audio position B in which the volume is low using volume adjustment value 34d1 calculated in step S8F-4, and adjusts the volume of the audio in a directivity state after the emphasis process in audio position A in which the volume is high (S8F-4). Accordingly, after the volume is adjusted in the respective audio positions A and B by volume adjustor 34c, the volume (for example, 55 dB (=55 dB+0 dB)) of the audio in the directivity state after the emphasis process in audio position A and the volume (for example, 54.5 dB (=50 dB+4.5 dB)) of the audio in the directivity state after the emphasis process in audio position B are substantially the same.

Further, after step S8F-4, volume adjustment value calculator 34d or emphasis processor 34b combines audio data in a directivity state after the emphasis process in audio position A and audio data in a directivity state after the emphasis process in audio position B (S8F-5).

Volume adjustment value calculator 34d calculates the acoustic level (for example, 57.8 dB) at a predetermined time of the audio data in a directivity state after the combination process in step S8F-5 (S8F-6). Volume adjustment value calculator 34d compares the acoustic level at a predetermined time of the audio data in a directional state after the combination process calculated in step S8F-6 with the acoustic level at a predetermined time of the audio data in a non-directional state before the emphasis process calculated in step S8F-2 and calculates a value (for example, 6.5 dB corresponding to 90% (=7.2 dB×90%)) proportional to a difference (for example, 7.2 dB (=65 dB−57.8 dB)) between the acoustic levels as volume adjustment value 34d1 (S8F-7). Further, volume adjustor 34c performs, for example, adjustment to add the volume of the audio in a directivity state after the combination process in which the volume is low using volume adjustment value 34d1 calculated in step S8F-7 (S8F-7). Accordingly, the volume (for example, 65 dB) of the audio in non-directivity state before the emphasis process and the volume (for example, 64.3 dB (=57.8 dB+6.5 dB)) of the audio in a directivity state after the combination process are included in a certain range.

Thus, audio processing system 10F of the second modification example of the third exemplary embodiment receives a plurality of designation directions, adjusts the volume of the audio data in a directivity state after an emphasis process in each designation direction using the first volume adjustment value (for example, 4.5 dB and 0 dB described above) that is a value corresponding to the difference between the respective acoustic levels of the audio data in a directivity state after an emphasis process in each designation direction, performs the combination process on the audio data in the directivity state after an emphasis process in the plurality of designation directions, and adjusts the volume of the audio data in a directivity state after the combination process using the second volume adjustment value (for example, 6.5 dB described above) that is the value corresponding to the difference between the acoustic level of the audio data after the combination process and the acoustic level of the audio data in a non-directivity state.

Accordingly, even when there are a plurality of designation directions that are emphasis process targets and the volume of the audio data after the respective emphasis processes differs, audio processing system 10F can adjust the volume of the audio data (for example, audio data of which the volume is low) in each designation direction using the first volume adjustment value (for example, 4.5 dB described above) corresponding to the audio data so that the volume of the individual audio data corresponding to each designation direction is substantially the same, can also adjust the volume of at least one other audio data (for example, audio data of which the volume is high) using the first volume adjustment value (for example, above 0 dB) corresponding to the at least one other audio data, and can also adjust the volume of audio data in a directivity state using the second volume adjustment value (for example, 6.5 dB described above) even when the volume of the audio data in a non-directivity state before the emphasis process and the volume of the audio data in a directivity state after the combination process are different from each other. Accordingly, the volume of the audio data in a non-directivity state and the volume of the audio data in a directivity state after the combination process can be substantially the same volume.

In step S8F-3 illustrated in FIG. 21, the reference volume is not limited to, for example, high acoustic levels in respective audio positions A and B corresponding to designation positions A' and B' designated in step S2F, and may be a predetermined volume setting value or an arbitrarily changeable volume setting value (see, for example, a fourth exemplary embodiment to be described below), or may be an acoustic level of the audio data in a non-directivity state (see the acoustic level calculated in step S8F-2).

In this case, volume adjustment value calculator 34d calculates a value (for example, a value corresponding to 90% described above) proportional to a difference between the acoustic level of the audio data in respective audio positions A and B and the reference volume as volume adjustment values 34d1 of the audio data in respective audio positions A and B, instead of setting one of volume adjustment values 34d1 of the audio data in audio positions A and B to 0 dB as described in step S8F-4 illustrated in FIG. 21. Further, volume adjustor 34c adjusts the volume of the audio data in a directivity state in audio positions A and B using respective volume adjustment values 34d1 calculated in audio positions A and B.

Further, while the example in which two of A' and B' have been designated as the plurality of designation positions in step S2F of FIG. 21 has been described, three or more designation positions may be designated. Even when three or more designation positions are designated, the process in step S8F of FIG. 21 described above is the same as the process when two designation positions A' and B' are designated.

Fourth Exemplary Embodiment

Figure 22A:
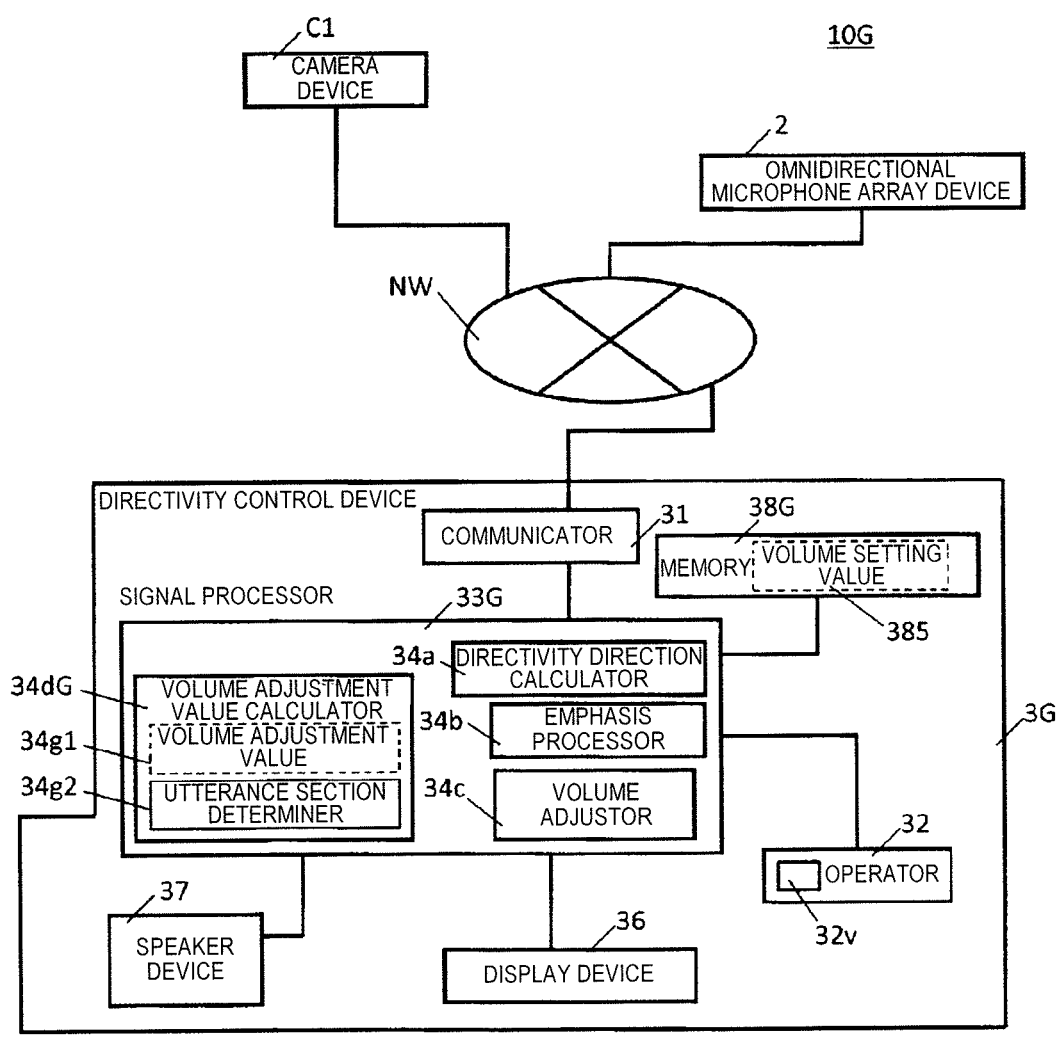
FIG. 22A is a block diagram illustrating an example of a system configuration of an audio processing system of a fourth exemplary embodiment.

In the fourth exemplary embodiment, signal processor 33G stores a value input from operator 32 according to an input operation of a user for a predetermined volume setting screen (not shown) in memory 38G as volume setting value 385 of audio output from speaker device 37 (see FIG. 22A). FIG. 22A is a block diagram illustrating an example of a system configuration of audio processing system 10G of the fourth exemplary embodiment. In audio processing system 10G illustrated in FIG. 22A, directivity control device 3 is replaced with directivity control device 3G, and other components are the same, as compared to audio processing system 10 illustrated in FIG. 1. Accordingly, description of the same content will be simplified or omitted and different content will be described.

Signal processor 33G includes directivity direction calculator 34a, emphasis processor 34b, volume adjustor 34c, and volume adjustment value calculator 34dG. Volume adjustment value calculator 34dG holds volume adjustment value 34g1 that is a result of calculation of volume adjustment value calculator 34dG, and includes utterance section determiner 34g2. Utterance section determiner 34g2 may be provided separately from volume adjustment value calculator 34dG as long as utterance section determiner 34g2 is included in signal processor 33G.

When it is determined by utterance section determiner 34g2 that predetermined audio data (for example, audio data of a person) in a designation direction from omnidirectional microphone array device 2 to audio position A corresponding to the designation position input by operator 32 is detected, volume adjustment value calculator 34dG calculates a difference between the acoustic level of the audio data and volume setting value 385 as volume adjustment value 34g1 regardless of the non-directivity state or the directivity state.

Figure 22B:
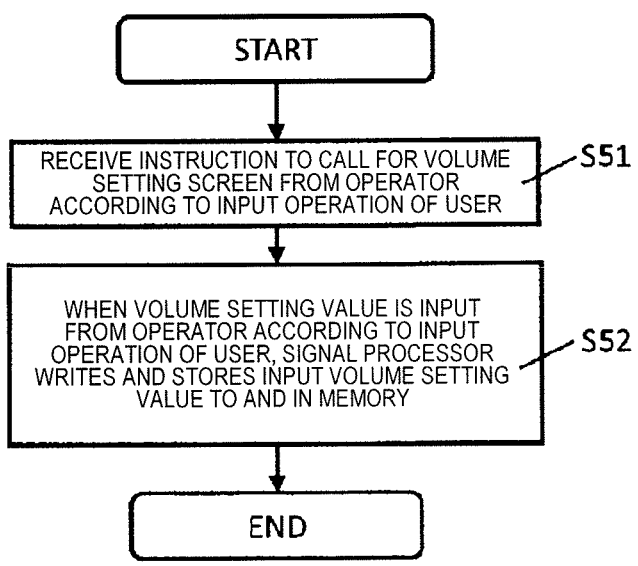
FIG. 22B is a flowchart illustrating an example of an operation procedure regarding pre-setting of a volume setting value.
Figure 22C:
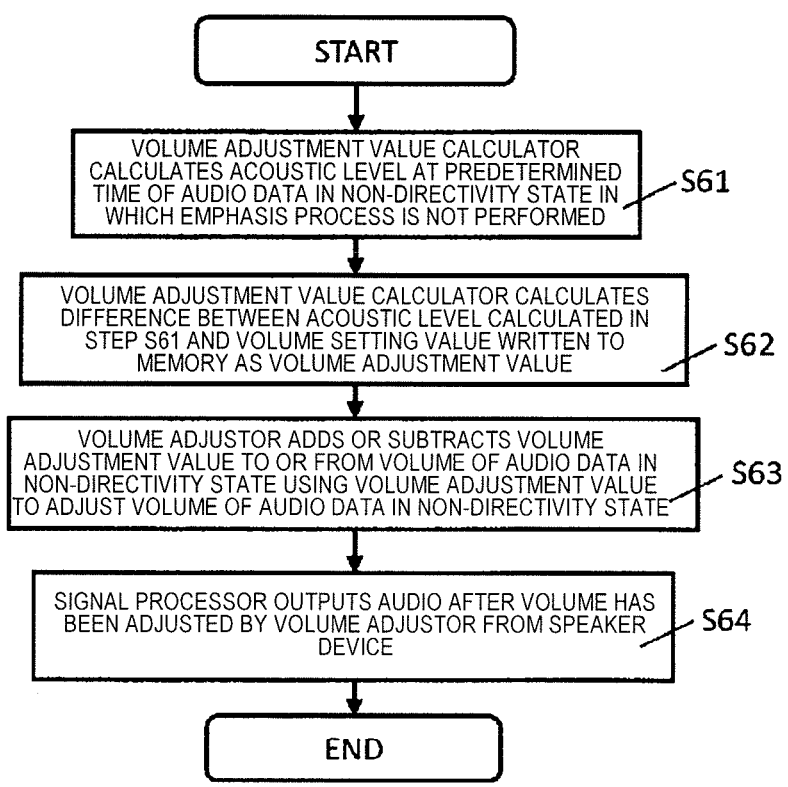
FIG. 22C is a flowchart illustrating an example of an operation procedure regarding volume adjustment of non-directional audio before an emphasis process in an actual operation of an audio processing system of the fourth exemplary embodiment.
Figure 23A:
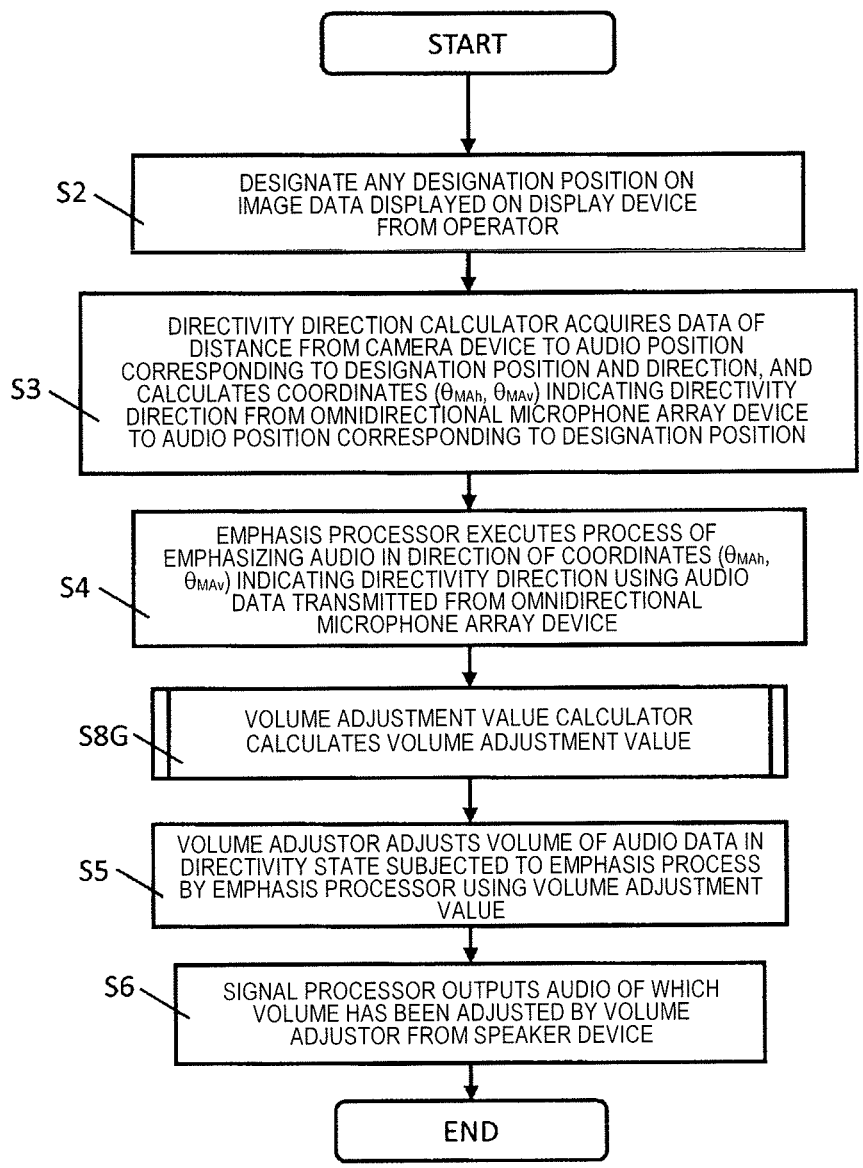
FIG. 23A is a flowchart illustrating an example of an operation procedure regarding volume adjustment of directional audio after an emphasis process in an actual operation of the audio processing system of the fourth exemplary embodiment.
Figure 23B:
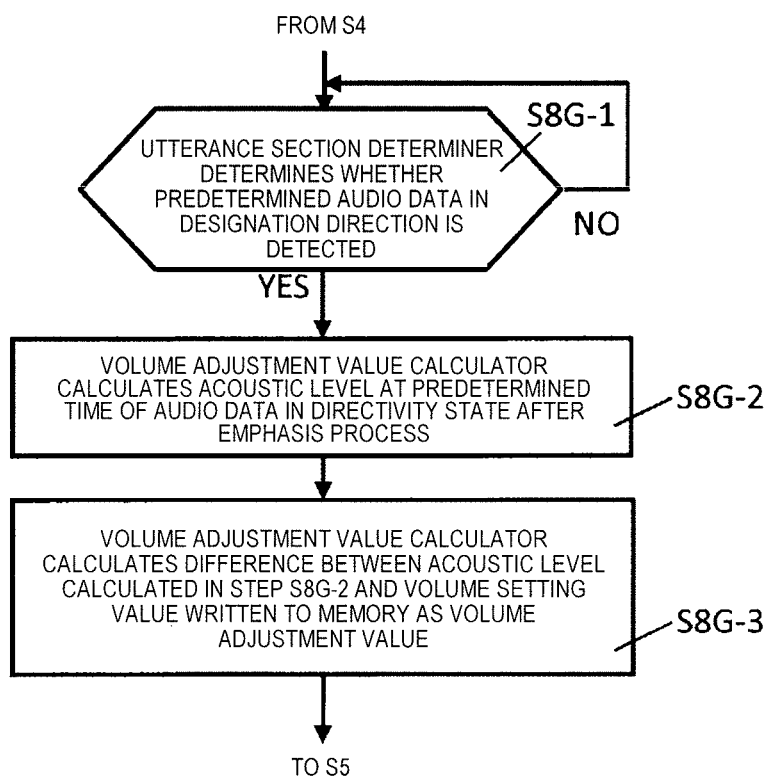
FIG. 23B is a flowchart illustrating an example of an operation procedure regarding volume adjustment of directional audio after an emphasis process in an actual operation of the audio processing system of the fourth exemplary embodiment.

Next, an operation procedure of audio processing system 10G of the present exemplary embodiment will be described with reference to FIGS. 22B and 22C and FIGS. 23A and 23B. FIG. 22B is a flowchart illustrating an example of an operation procedure regarding pre-setting of volume setting value 385. FIG. 22C is a flowchart illustrating an example of an operation procedure regarding volume adjustment of non-directional audio before an emphasis process in an actual operation of audio processing system 10G of the fourth exemplary embodiment. FIGS. 23A and 23B are flowcharts illustrating an example of an operation procedure regarding volume adjustment of directional audio after an emphasis process in an actual operation of audio processing system 10G of the fourth exemplary embodiment. In FIGS. 23A and 23B, the same processes as the respective processes in FIG. 7 corresponding to audio processing system 10 of the first exemplary embodiment are denoted with the same step numerals, description thereof will be simplified or omitted, and different content will be described.

In FIG. 22B, when an instruction to call for a volume setting screen is received from operator 32 according to an input operation of the user (S51), signal processor 33G displays the volume setting screen on display device 36 according to the instruction from operator 32. When volume setting value 385 is input from operator 32 according to an input operation of the user, signal processor 33G writes and stores input volume setting value 385 to and in memory 38G (S52). Thus, a process of pre-setting volume setting value 385 in memory 38G ends.

In FIG. 22C, volume adjustment value calculator 34dG calculates the acoustic level at a predetermined time of the audio data in the non-directivity state, in a non-directivity state in which the emphasis process is not performed by emphasis processor 34b (S61). Volume adjustment value calculator 34dG calculates a difference between the acoustic level calculated in step S61 and volume setting value 385 written to memory 38G as volume adjustment value 34g1 (S62).

Volume adjustor 34c adds or subtracts volume adjustment value 34g1 to or from the volume of the audio data in the non-directivity state in which the emphasis process is not performed by emphasis processor 34b using volume adjustment value 34g1 calculated in step S62 to adjust the volume of the audio data in the non-directivity state (S63). Signal processor 33G outputs the audio after the volume is adjusted by volume adjustor 34c from speaker device 37 (S64).

In FIG. 23A, after step S4, the volume adjustment value is calculated by volume adjustment value calculator 34dG (S8G). More specifically, in FIG. 23B, utterance section determiner 34g2 determines whether predetermined audio data (for example, audio data of a person) in the designation direction to audio position A corresponding to the designation position input by operator 32 is detected, based on the audio data in a directivity state after the emphasis process generated by emphasis processor 34b (S8G-1).

When it is determined by utterance section determiner 34g2 that predetermined audio data (for example, audio data of a person) in a designation direction from omnidirectional microphone array device 2 to audio position A corresponding to the designation position input by operator 32 is detected (YES in S8G-1), volume adjustment value calculator 34dG calculates the acoustic level at a predetermined time of the audio data in a directivity state after an emphasis process (S8G-2).

Volume adjustment value calculator 34dG calculates a difference between the acoustic level of the audio data in a directivity state calculated in step S8G-2 and volume setting value 385 written to memory 38G as volume adjustment value 34g1 (S8G-3). Thus, a process of calculating the volume adjustment value in volume adjustment value calculator 34dG ends. Since a process subsequent to step S8G is the same as each process subsequent to step S5 illustrated in FIG. 7, description thereof will be omitted.

Thus, audio processing system 10G of the present exemplary embodiment can determine whether predetermined audio data is detected in the designation direction based on the audio data in a directivity state after the emphasis process, calculate the difference between the acoustic level of the audio data in a directivity state after the emphasis process and a predetermined volume setting value as the third volume adjustment value (volume adjustment value 34g1) when it is determined that the audio data is detected, and adjust the volume of the audio data in a directivity state using calculated volume adjustment values 34g1. Accordingly, when switching occurs from the non-directivity state to the directivity state, the volume of the audio data in the directivity state to be output can be fixed to a certain range (more specifically, a predetermined range including a predetermined volume setting value).

Further, since audio processing system 10G can calculate the difference between the acoustic level of the audio data in a non-directivity state and the predetermined volume setting value as a fourth volume adjustment value (volume adjustment value 34g1), and adjust the volume of the audio data in a non-directivity state using calculated volume adjustment value 34g1, it is possible to fix the volume of the audio data in the non-directivity state to be output in a predetermined range including volume setting value 385 regardless of the directivity state or the non-directivity state.

Fifth Exemplary Embodiment

Figure 24A:
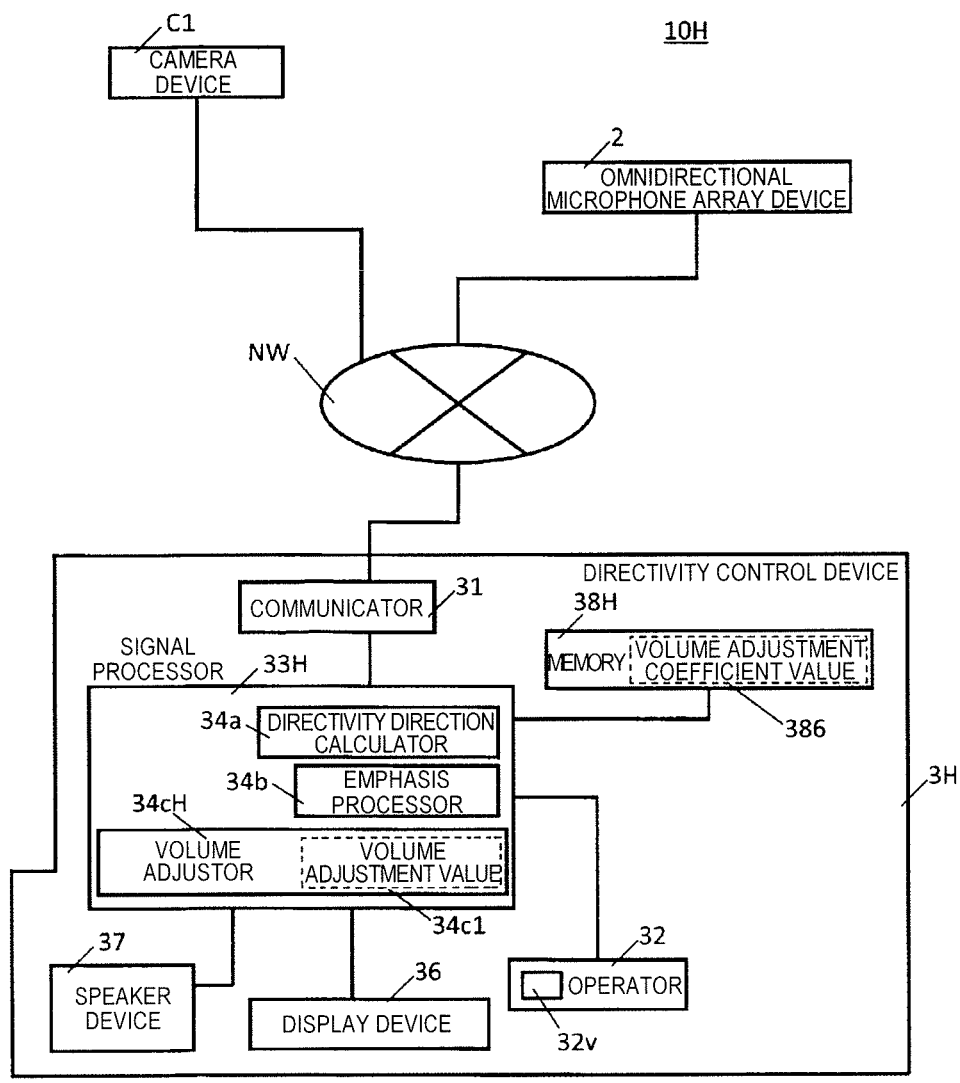
FIG. 24A is a block diagram illustrating an example of a system configuration of an audio processing system of a fifth exemplary embodiment.

In a fifth exemplary embodiment, signal processor 33H adjusts the volume of the audio data in a directivity state using volume adjustment coefficient value 386 for each frequency and fixed volume adjustment value 34c1 for holding or attenuating the volume adjustment value to be constant in a specific frequency bandwidth (see FIG. 24A). FIG. 24A is a block diagram illustrating an example of a system configuration of the audio processing system of the fifth exemplary embodiment. In audio processing system 10H illustrated in FIG. 24A, directivity control device 3 is replaced with directivity control device 3H and other components are the same as compared to audio processing system 10 illustrated in FIG. 1. Accordingly, description of the same content will be simplified or omitted and different content will be described.

Volume adjustor 34cH adjusts volume of the audio data in a directivity state subjected to the emphasis process by emphasis processor 34b using volume adjustment coefficient value 386 for each frequency stored in memory 38H and volume adjustment value 34c1 (see the first exemplary embodiment) defined in the operation of volume adjustor 34cH in advance. Since a volume adjustment method using volume adjustment value 381 is the same as in the first exemplary embodiment, detailed description thereof will be omitted.

Here, volume adjustment coefficient values 386 for each frequency will be described with reference to FIGS. 25A and 25B. FIG. 25A is a diagram illustrating a first example of frequency characteristics of volume adjustment coefficient value 386. FIG. 25B is a diagram illustrating a second example of the frequency characteristics of volume adjustment coefficient value 386.

In the first example illustrated in FIG. 25A, for example, the volume adjustment coefficient value is 100% in order to hold the volume adjustment value to be constant between 300 Hz and 3400 Hz that is a human's main audible band. In a frequency bandwidth other than 300 Hz to 3400 Hz, the volume adjustment coefficient value decreases from 100%, and thus, the volume adjustment value is attenuated.

On the other hand, in the second example illustrated in FIG. 25B, for example, the volume adjustment value becomes a value close to 0% without limit in order to attenuate the volume adjustment value in a predetermined range of frequency bandwidth including a specific frequency (for example, a frequency of 500 Hz in which a noise source is present). In a frequency bandwidth other than the frequency bandwidth, the volume adjustment coefficient value is 100%, and thus, the volume adjustment value is held to be constant.

Figure 24B:
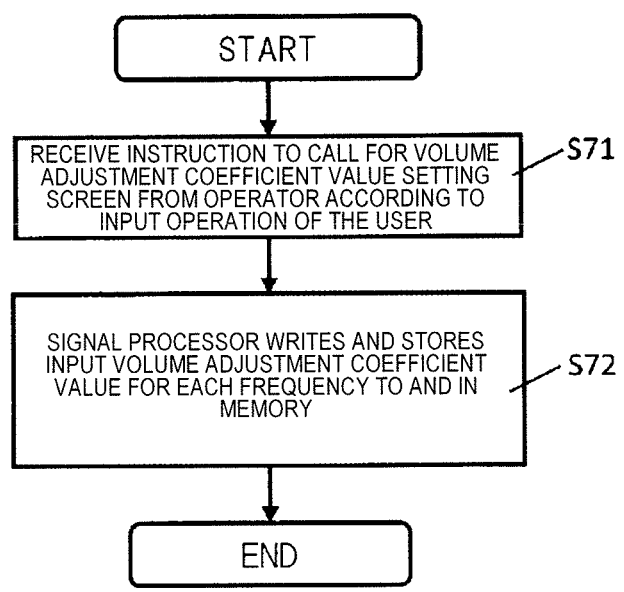
FIG. 24B is a flowchart illustrating an example of an operation procedure regarding pre-setting of a volume adjustment coefficient value.
Figure 26:
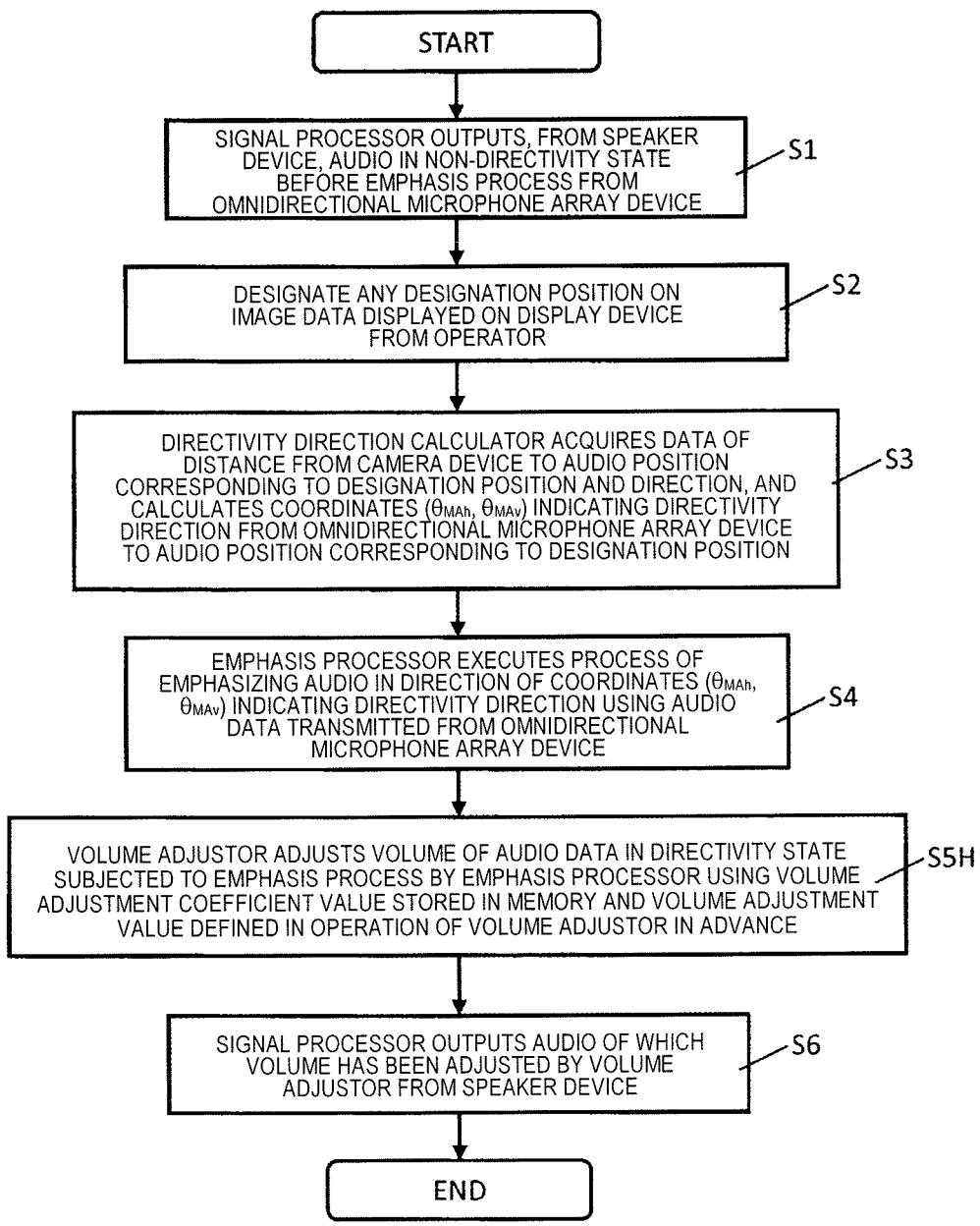
FIG. 26 is a flowchart illustrating an example of an operation procedure in an actual operation of the audio processing system of the fifth exemplary embodiment.

Next, an operation procedure of audio processing system 10H of the present exemplary embodiment will be described with reference to FIGS. 24B and 26. FIG. 24B is a flowchart illustrating an example of an operation procedure regarding pre-setting of volume adjustment coefficient value 386. FIG. 26 is a flowchart illustrating an example of an operation procedure in an actual operation of audio processing system 10H according to the fifth exemplary embodiment. In FIG. 26, the same processes as the respective processes in FIG. 7 corresponding to audio processing system 10 of the first exemplary embodiment are denoted with the same step numerals, description thereof will be simplified or omitted, and different content will be described.

In FIG. 24B, when an instruction to call for a volume adjustment coefficient value setting screen is received from operator 32 according to an input operation of the user (S71), signal processor 33H displays the volume adjustment coefficient value setting screen on display device 36 according to the instruction from operator 32. When volume adjustment coefficient value 386 for each frequency is input from operator 32 according to an input operation of the user, signal processor 33H writes and stores input volume adjustment coefficient value 386 for each frequency to and in memory 38H (S72). Thus, a process of pre-setting volume adjustment coefficient value 386 in memory 38H ends.

In FIG. 26, after step S4, volume adjustor 34cH adjusts the volume of the audio data in a directivity state subjected to the emphasis process by emphasis processor 34b using volume adjustment coefficient value 386 stored in memory 38H through the pre-setting process illustrated in FIG. 24B and volume adjustment value 34c1 defined in an operation of volume adjustor 34cH in advance (S5H). Since a process subsequent to step S5H is the same as step S6 illustrated in FIG. 7, description thereof will be omitted.

Thus, audio processing system 10H of the present exemplary embodiment can read volume adjustment coefficient value 386 of the volume adjustment value for each frequency input with respect to a predetermined volume adjustment coefficient value setting screen from memory 38H, and adjust the volume of the audio data in a directivity state using volume adjustment coefficient value 386 and volume adjustment value 34g1, it is possible to output appropriate volume of the audio data in a directivity state according to an installation environment of audio processing system 10H.

Further, in audio processing system 10H, since volume adjustment coefficient value 386 decreases the volume adjustment value of a frequency bandwidth other than a predetermined frequency bandwidth, it is possible to output an appropriate volume of the audio data in a directivity state in the predetermined frequency bandwidth in a state in which effects of the volume of the audio data in the frequency bandwidth other than the predetermined frequency bandwidth (for example, effects of audio in an audio band other than conversation speech of a person) are excluded.

Further, in audio processing system 10II, since volume adjustment coefficient value 386 decreases the volume adjustment value of a certain range of frequency bandwidth including predetermined frequencies, it is possible to output an appropriate volume of the audio data in a directivity state in a frequency bandwidth other than the certain range of frequency bandwidth including predetermined frequencies in a state in which effects of the volume of the audio data in the certain range of frequency bandwidth including predetermined frequencies (for example, effects of a noise source) are excluded.

While various exemplary embodiments have been described above with reference to the drawings, it is understood that the present disclosure is not limited to such examples. It is obvious to those skilled in the art that various changes or modifications can be made within the scope defined in the claims, and it is understood that the changes or modifications belong to the technical scope of the present disclosure.

What is claimed is:
1. An audio processing system, comprising:
an audio collector that includes a plurality of audio collection elements, and collects audio in a non-directivity state using the audio collection elements;

an operator that receives an input of one or more designation directions for audio emphasis for switching from the non-directivity state to a directivity state;

an emphasis processor that generates audio data in the directivity state obtained by performing an emphasis process on the audio data in the designation direction from the audio collector using audio data collected by the audio collector according to the input of the designation direction;

a volume adjustor that adjusts volume of the audio data in the directivity state generated by the emphasis processor; and an audio output that outputs the audio in the non-directivity state collected by the audio collector or the audio in the directivity state after the volume is adjusted by the volume adjustor.

2. The audio processing system of claim 1, wherein the operator receives release of the designation direction for switching from the directivity state to the non-directivity state, and the volume adjustor adjusts volume of the audio data in the directivity state into volume of the audio data in the non-directivity state collected by the audio collector before the emphasis process in the emphasis processor according to the release of the designation direction.

3. The audio processing system of claim 1, wherein the volume adjustor adjusts volume of the audio data in the directivity state using a predetermined volume adjustment value.

4. The audio processing system of claim 1, wherein the volume adjustor adjusts the volume of the audio data in the directivity state using the volume adjustment value stored in a storage.

5. The audio processing system of claim 1, further comprising:

a storage that stores a setting file to which a predetermined volume adjustment value is written, wherein the volume adjustor adjusts the volume of the audio data in the directivity state using the predetermined volume adjustment value written to the setting file stored in the storage.

6. The audio processing system of claim 1, further comprising:

an imaging unit that captures an image of an audio collection area of the audio collector;

a display that displays an image of the audio collection area imaged by the imaging unit; and a storage that stores a volume adjustment value for each area of the image of the audio collection area input by the operator with respect to a predetermined volume adjustment value setting screen, wherein the volume adjustor adjusts the volume of the audio data in the directivity state using the volume adjustment value for each area stored in the storage according to the area of the image of the audio collection area corresponding to the designation position on the image of the audio collection area displayed on the display.

7. The audio processing system of claim 1, further comprising:

a storage that stores a volume adjustment value of each audio collector input by the operator with respect to a predetermined volume adjustment value setting screen;

an imaging unit that is associated with the audio collector, and captures an image of an audio collection area of the audio collector; and a display that displays an image of the audio collection area imaged by the imaging unit, wherein a plurality of combinations with which the audio collector and the imaging unit are associated are provided, and the volume adjustor adjusts the volume of the audio data in the directivity state using the volume adjustment value corresponding to a selected audio collector stored in the storage according to selection of any one of the audio collectors.

8. The audio processing system of claim 1, further comprising:

an utterance determiner that determines whether predetermined audio data is detected in the designation direction input by the operator based on the audio data in the directivity state generated by the emphasis processor; and a volume adjustment value calculator that calculates a volume adjustment value based on a difference between acoustic levels of the predetermined audio data before and after the emphasis process in the emphasis processor when it is determined that the predetermined audio data is detected in the designation direction, wherein the volume adjustor adjusts the volume of the audio data in the directivity state using the volume adjustment value calculated by the volume adjustment value calculator.

9. The audio processing system of claim 1, further comprising:

a storage that stores a directivity angle indicating a beam width of directivity in the directivity state input by the operator with respect to a predetermined directivity angle setting screen; and a volume adjustment value calculator that calculates the volume adjustment value based on the directivity angle stored in the storage, wherein the volume adjustor adjusts the volume of the audio data in the directivity state using the volume adjustment value calculated by the volume adjustment value calculator.

10. The audio processing system of claim 8, wherein a plurality of designation directions are input by the operator, the volume adjustment value calculator calculates each value corresponding to a difference between a reference volume and each acoustic level of the audio data subjected to the emphasis process by the emphasis processor in the plurality of designation directions as a first volume adjustment value of each audio data after the emphasis process, the volume adjustor adjusts each volume of the audio data subjected to the emphasis process by the emphasis processor in the plurality of designation directions using the first volume adjustment value for each audio data after the emphasis process calculated by the volume adjustment value calculator, the emphasis processor performs a combination process on the audio data subjected to the emphasis process in the plurality of designation directions, the volume adjustment value calculator calculates a value corresponding to a difference between an acoustic level of the audio data subjected to the combination process by the emphasis processor and an acoustic level of the audio data in the non-directivity state as a second volume adjustment value, and the volume adjustor adjusts the volume of the audio data subjected to the combination process by the emphasis processor using the second volume adjustment value calculated by the volume adjustment value calculator.

11. The audio processing system of claim 1, further comprising:
an utterance determiner that determines whether predetermined audio data is detected in the designation direction input by the operator based on the audio data in the directivity state generated by the emphasis processor; and
a volume adjustment value calculator that calculates a difference between an acoustic level of the audio data in the directivity state generated by the emphasis processor and a predetermined volume setting value as a third volume adjustment value when it is determined that the predetermined audio data is detected in the designation direction,
wherein the volume adjustor adjusts the volume of the audio data in the directivity state using the third volume adjustment value calculated by the volume adjustment value calculator.

12. The audio processing system of claim 11,
wherein the volume adjustment value calculator calculates a difference between an acoustic level of audio data in the non-directivity state collected by the audio collector and the predetermined volume setting value as a fourth volume adjustment value, and
the volume adjustor adjusts the volume of the audio data in the non-directivity state using the fourth volume adjustment value calculated by the volume adjustment value calculator.

13. The audio processing system of claim 1, further comprising:
a storage that stores a volume adjustment coefficient of a volume adjustment value for each frequency input by the operator with respect to a predetermined volume adjustment coefficient value setting screen,
wherein the volume adjustor adjusts the volume of the audio data in the directivity state using the volume adjustment coefficient of the volume adjustment value for each frequency stored in the storage, and a predetermined volume adjustment value.

14. The audio processing system of claim 13,
wherein the volume adjustment coefficient of the volume adjustment value for each frequency has a property of decreasing the volume adjustment value of a frequency bandwidth other than a predetermined frequency bandwidth.

15. The audio processing system of claim 13,
wherein the volume adjustment coefficient of the volume adjustment value for each frequency has a property of decreasing the volume adjustment value of a certain range of frequency bandwidth including predetermined frequencies.

16. An audio processing method in an audio processing system including an audio collector that collects audio in a non-directivity state using a plurality of audio collection elements, the audio processing method comprising:
receiving an input of one or more designation directions for audio emphasis for switching from the non-directivity state to a directivity state;
generating audio data in the directivity state obtained by performing an emphasis process on the audio data in the designation direction from the audio collector using audio data collected by the audio collector according to the input of the designation direction;
adjusting volume of the generated audio data in a directivity state; and
outputting the audio in the non-directivity state collected by the audio collector or the audio in the directivity state after the volume is adjusted.

* * * * *